(12) United States Patent
Ishida

(10) Patent No.: US 12,041,770 B2
(45) Date of Patent: Jul. 16, 2024

(54) FIELD EFFECT TRANSISTORS HAVING CONCAVE DRAIN EXTENSION REGION AND METHOD OF MAKING THE SAME

(71) Applicant: SANDISK TECHNOLOGIES LLC, Addison, TX (US)

(72) Inventor: Masashi Ishida, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 464 days.

(21) Appl. No.: 17/562,888

(22) Filed: Dec. 27, 2021

(65) Prior Publication Data

US 2023/0209821 A1    Jun. 29, 2023

(51) Int. Cl.
| | |
|---|---|
| H10B 41/35 | (2023.01) |
| G11C 16/04 | (2006.01) |
| H01L 29/06 | (2006.01) |
| H10B 41/10 | (2023.01) |
| H10B 41/27 | (2023.01) |

(52) U.S. Cl.
CPC ......... *H10B 41/35* (2023.02); *G11C 16/0483* (2013.01); *H01L 29/0649* (2013.01); *H10B 41/10* (2023.02); *H10B 41/27* (2023.02)

(58) Field of Classification Search
CPC ........ H10B 41/35; H10B 41/10; H10B 41/27; H10B 43/40; H10B 43/10; H10B 43/27; G11C 16/0483; G11C 16/14; G11C 16/24; G11C 16/26; H01L 29/0649; H01L 29/0847; H01L 29/165; H01L 29/0653
See application file for complete search history.

(56) References Cited

U.S. PATENT DOCUMENTS

| | | |
|---|---|---|
| 5,915,167 A | 6/1999 | Leedy |
| 9,859,422 B2 | 1/2018 | Nishikawa et al. |
| 10,115,735 B2 | 10/2018 | Amano et al. |
| 10,224,407 B2 | 3/2019 | Chowdhury et al. |
| 10,256,099 B1 | 4/2019 | Akaiwa et al. |
| 10,355,017 B1 | 7/2019 | Nakatsuji et al. |
| 10,355,100 B1 | 7/2019 | Ueda et al. |
| 10,770,459 B2 | 9/2020 | Iwata et al. |
| 10,910,020 B1 | 2/2021 | Kodate et al. |

(Continued)

OTHER PUBLICATIONS

Notification of Transmittal of the International Search Report and Written Opinion of the International Searching Authority for International Patent Application No. PCT/US2022/029529, mailed Oct. 13, 2022, 9 pages.

(Continued)

*Primary Examiner* — Karen Kusumakar
*Assistant Examiner* — Shawn Shaw Muslim
(74) *Attorney, Agent, or Firm* — THE MARBURY LAW GROUP PLLC

(57) ABSTRACT

A field effect transistor includes a source region embedded in a semiconductor material layer, a drain region embedded in the semiconductor material layer and laterally spaced from the source region by a channel, a gate stack including a gate dielectric and a gate electrode, a shallow trench isolation portion embedded in an upper portion of the semiconductor material layer and contacting the drain region and the gate stack, and a concave drain extension region continuously extending underneath the shallow trench isolation portion from a bottom surface of the gate dielectric to a bottom surface of the drain region.

20 Claims, 15 Drawing Sheets

(56) References Cited

U.S. PATENT DOCUMENTS

| | | | |
|---|---|---|---|
| 11,004,974 B1 | 5/2021 | Takimoto | |
| 2010/0109080 A1 | 5/2010 | Huang et al. | |
| 2012/0119293 A1 | 5/2012 | Chu et al. | |
| 2012/0313166 A1 | 12/2012 | Ito | |
| 2013/0181286 A1 | 7/2013 | Zhang et al. | |
| 2013/0187232 A1 | 7/2013 | Takasu | |
| 2014/0197487 A1* | 7/2014 | Cascino | H01L 29/407 438/286 |
| 2018/0331118 A1 | 11/2018 | Amano | |
| 2021/0280686 A1 | 9/2021 | Amano et al. | |
| 2021/0391351 A1 | 12/2021 | Takimoto et al. | |

OTHER PUBLICATIONS

U.S. Appl. No. 17/007,761, filed Aug. 31, 2020, Sandisk Technologies LLC.
U.S. Appl. No. 17/007,823, filed Aug. 31, 2020, Sandisk Technologies LLC.
U.S. Appl. No. 17/063,084, filed Oct. 5, 2020, Sandisk Technologies LLC.
U.S. Appl. No. 17/063,145, filed Oct. 5, 2020, Sandisk Technologies LLC.
U.S. Appl. No. 17/063,182, filed Oct. 5, 2020, Sandisk Technologies LLC.
U.S. Appl. No. 17/188,271, field Mar. 1, 2021, Sandisk Technologies LLC.
U.S. Appl. No. 17/316,015, filed May 10, 2021, Sandisk Technologies LLC.
U.S. Appl. No. 17/316,079, filed May 10, 2021, Sandisk Technologies LLC.
U.S. Appl. No. 17/501,163, filed Oct. 14, 2021, Sandisk Technologies LLC.
U.S. Appl. No. 17/348,305, filed Jun. 15, 2021, Sandisk Technologies LLC.
U.S. Appl. No. 17/348,328, filed Jun. 15, 2021, Sandisk Technologies LLC.
U.S. Appl. No. 17/362,121, filed Jun. 29, 2021, Sandisk Technologies LLC.
U.S. Appl. No. 17/474,699, filed Sep. 14, 2021, Sandisk Technologies LLC.
U.S. Appl. No. 17/474,760, filed Sep. 14, 2021, Sandisk Technologies LLC.
U.S. Appl. No. 17/496,099, filed Oct. 7, 2021, Sandisk Technologies LLC.
U.S. Appl. No. 17/496,122, filed Oct. 7, 2021, Sandisk Technologies LLC.
U.S. Appl. No. 17/529,802, filed Nov. 18, 2021, Sandisk Technologies LLC.
U.S. Appl. No. 17/562,635, filed Dec. 27, 2021, Sandisk Technologies LLC.

* cited by examiner

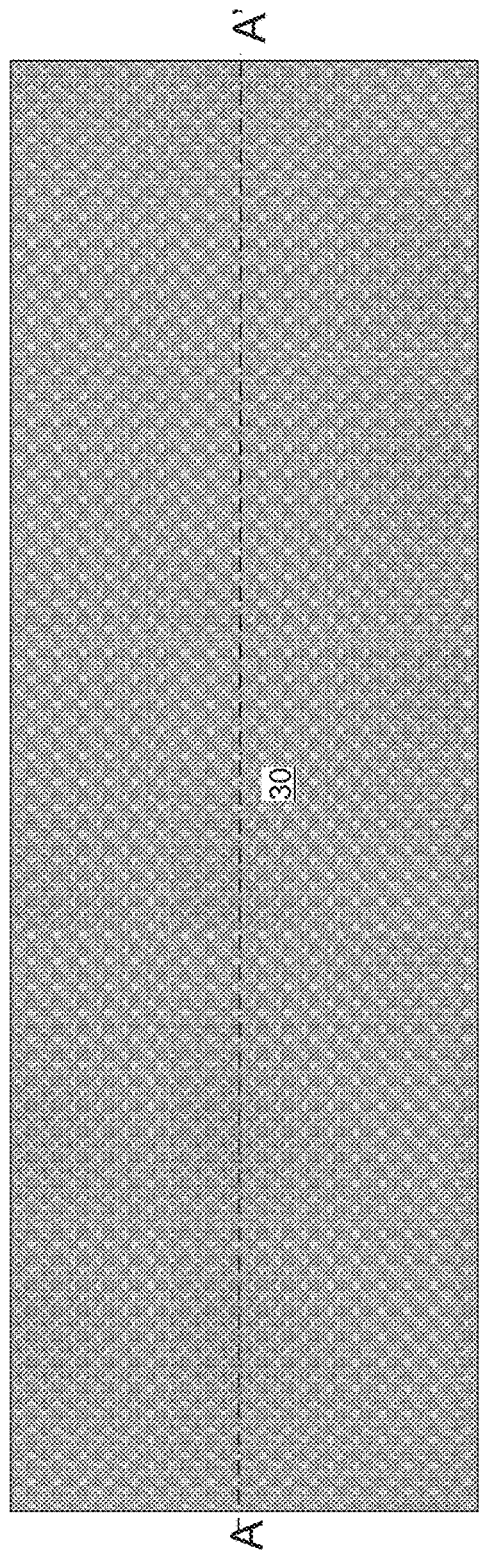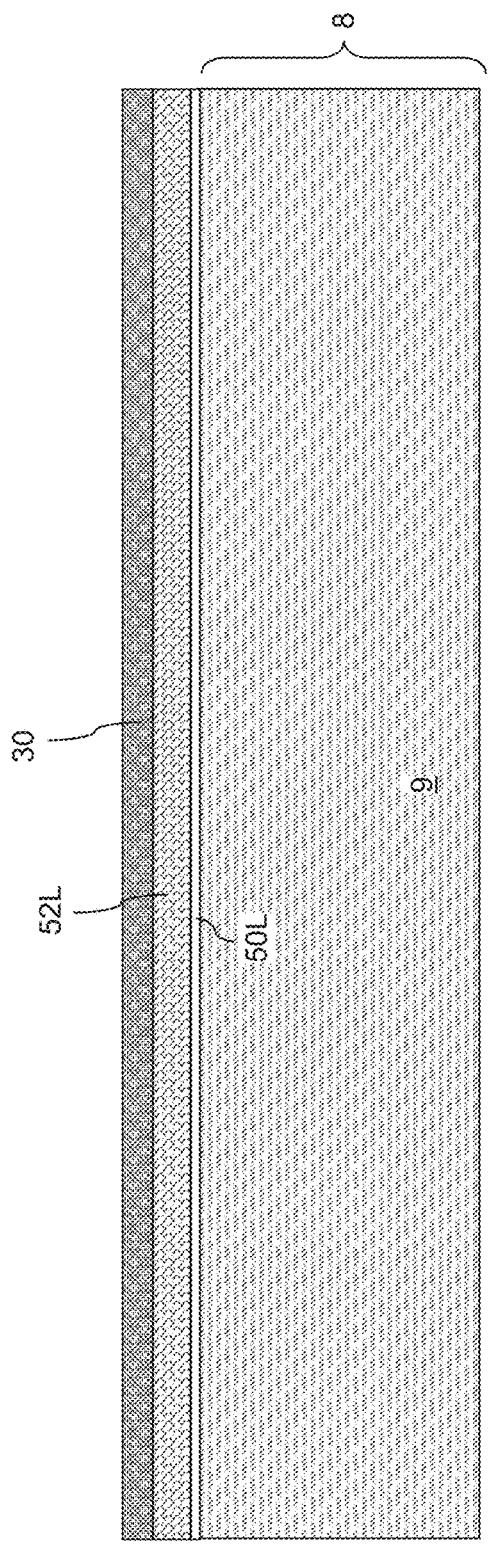

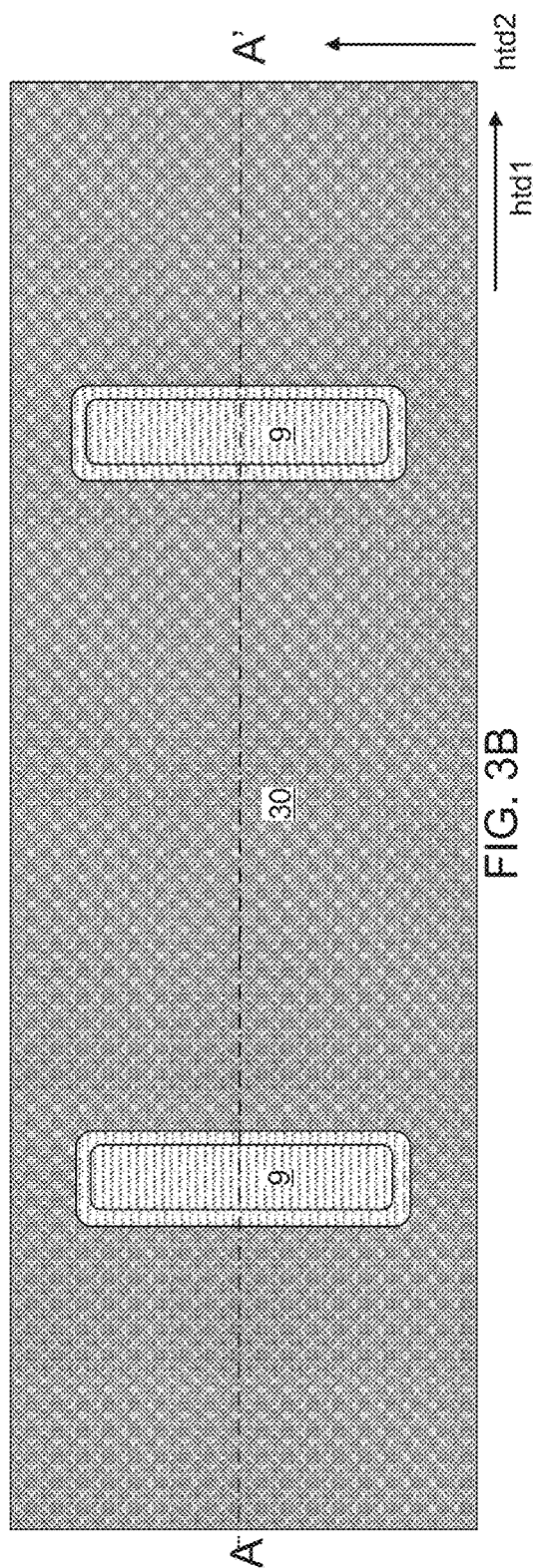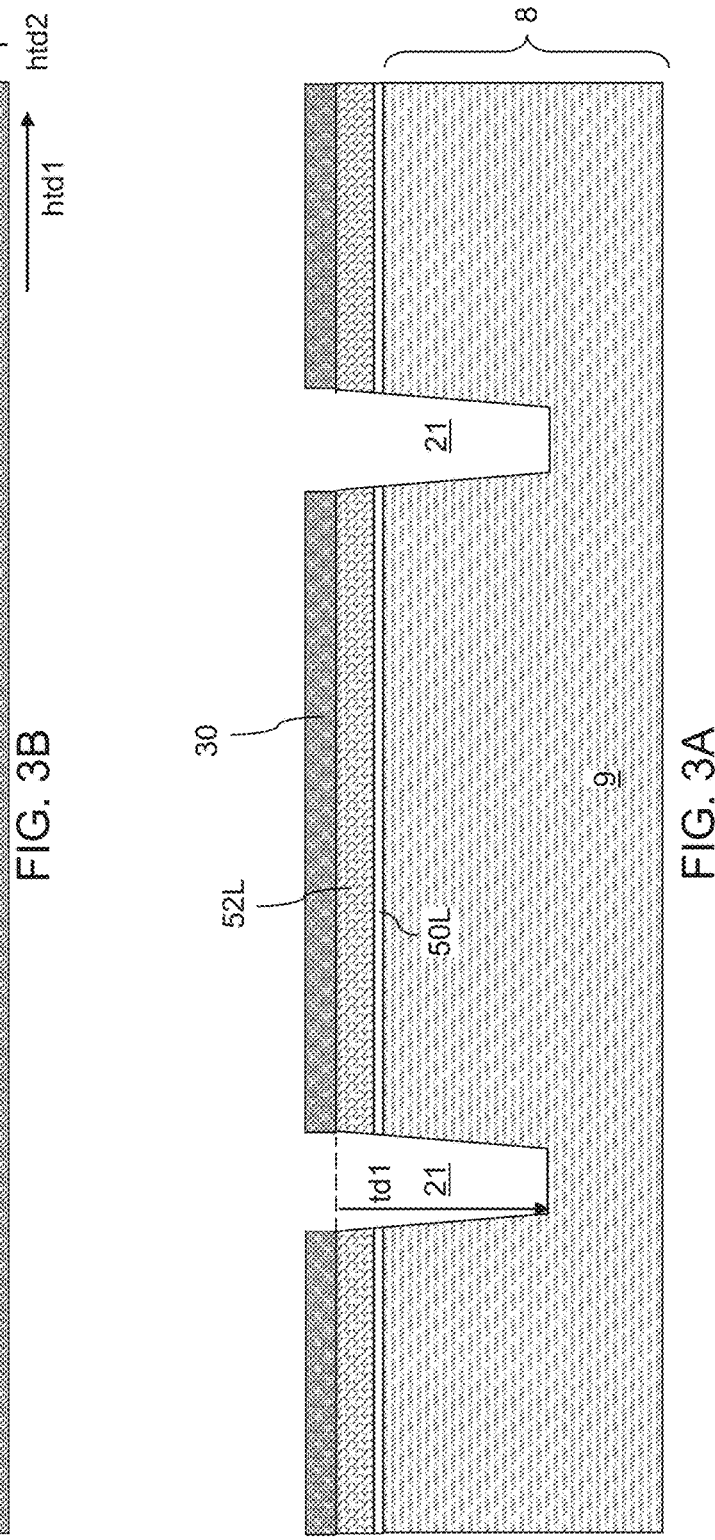
FIG. 3B
FIG. 3A

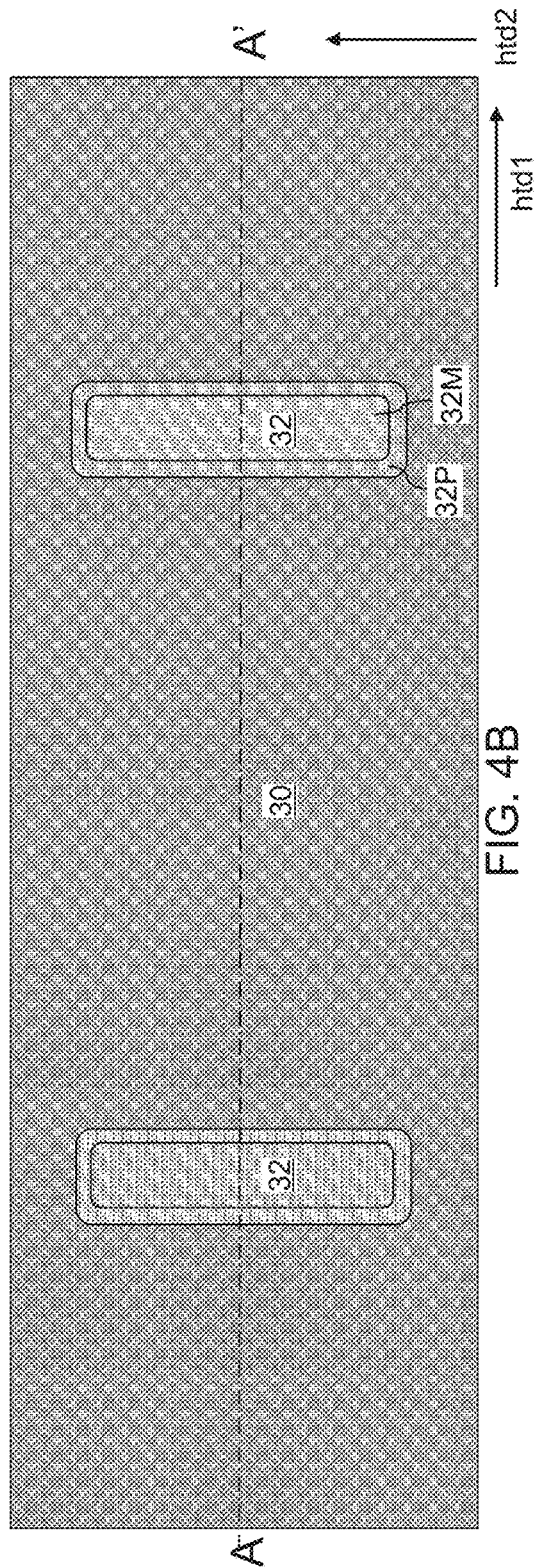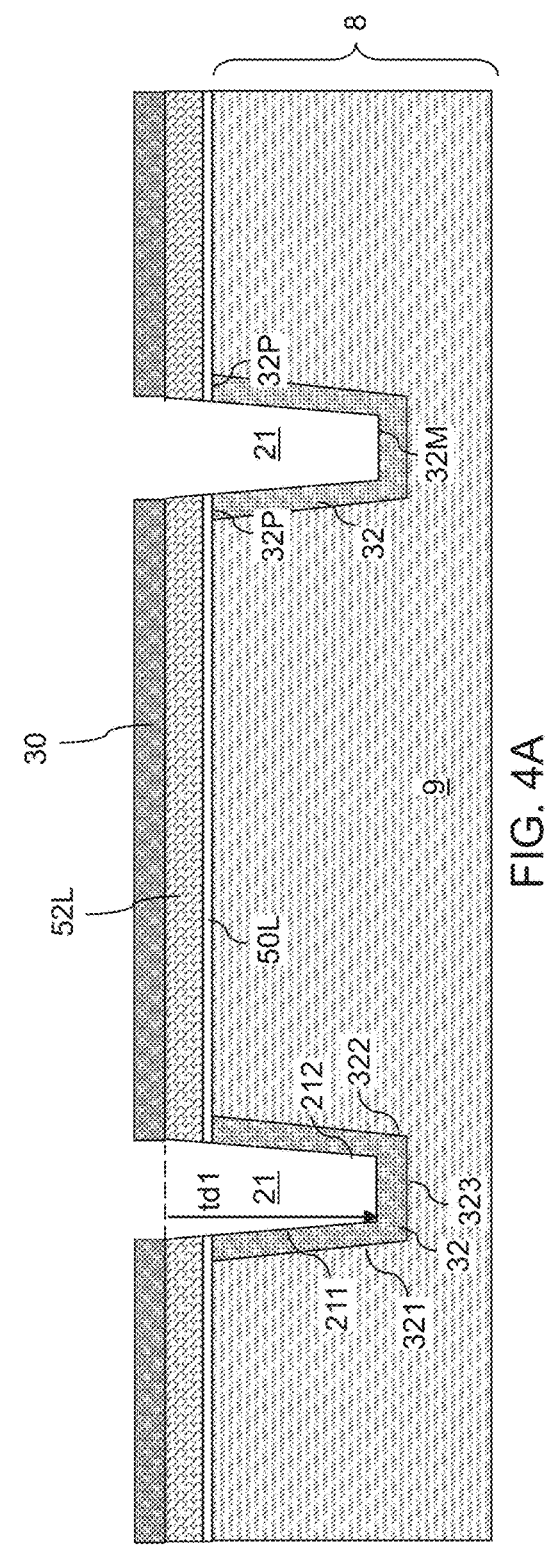

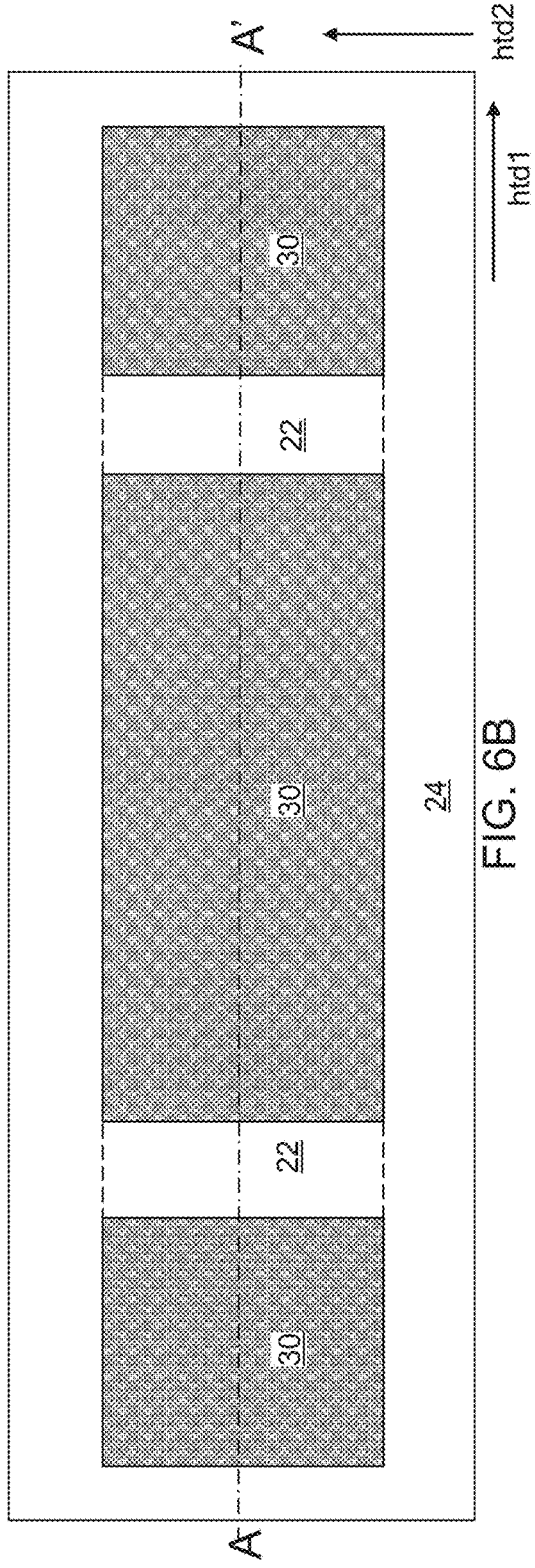
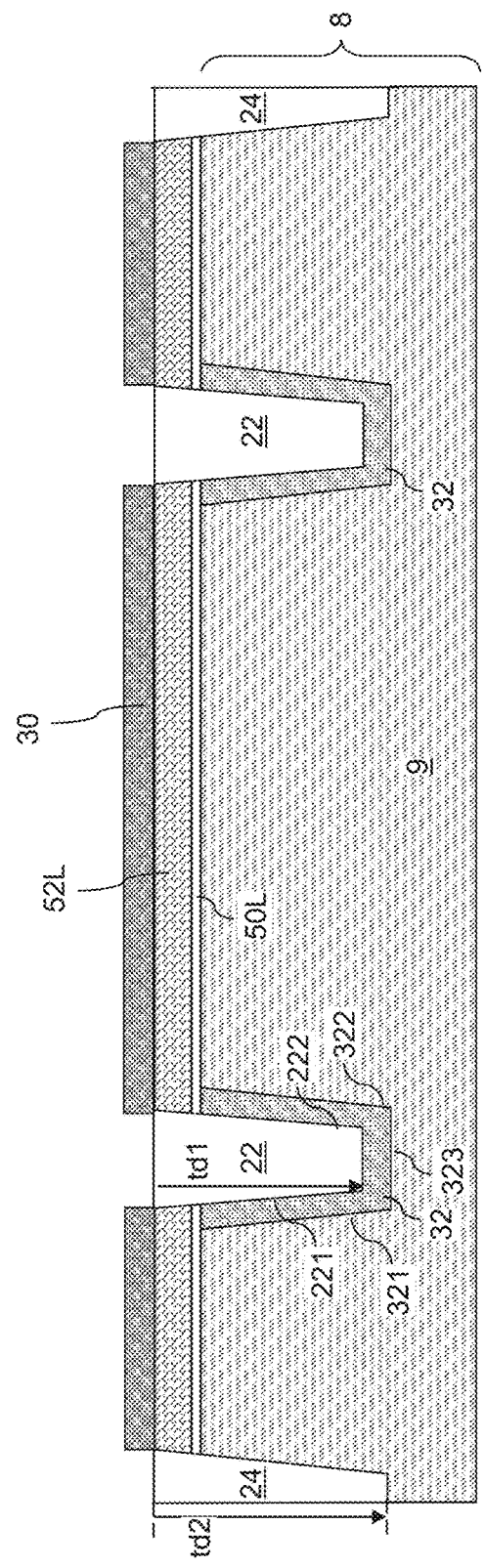

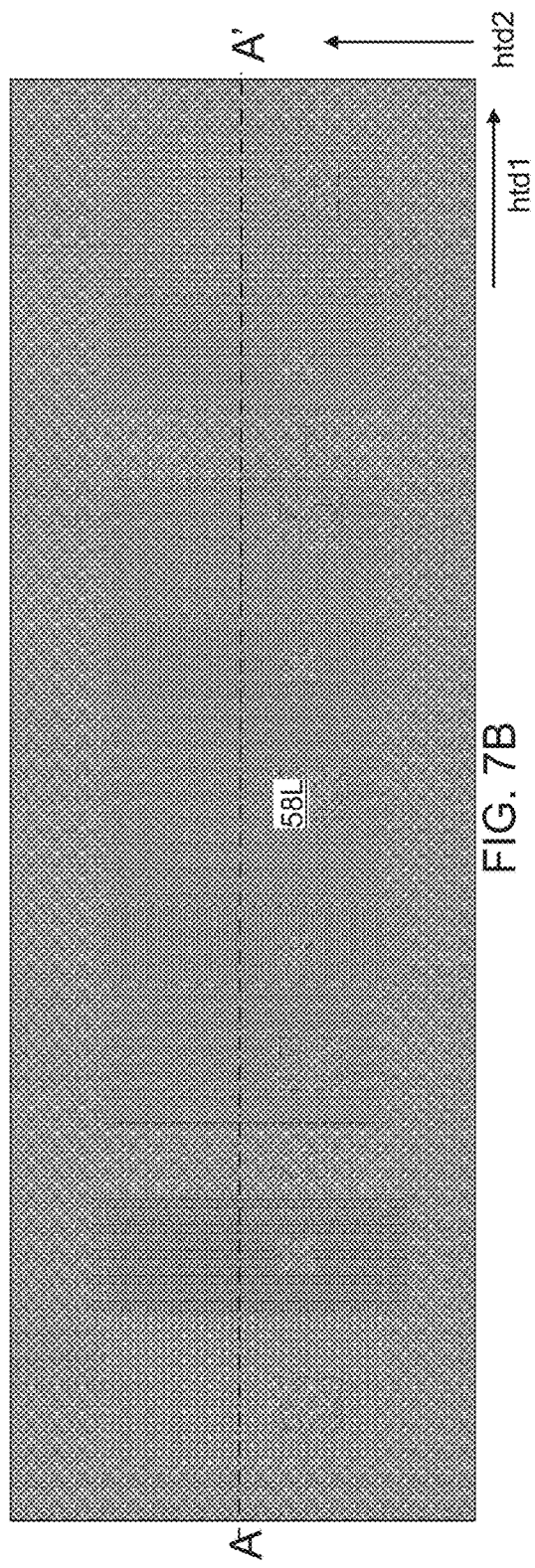
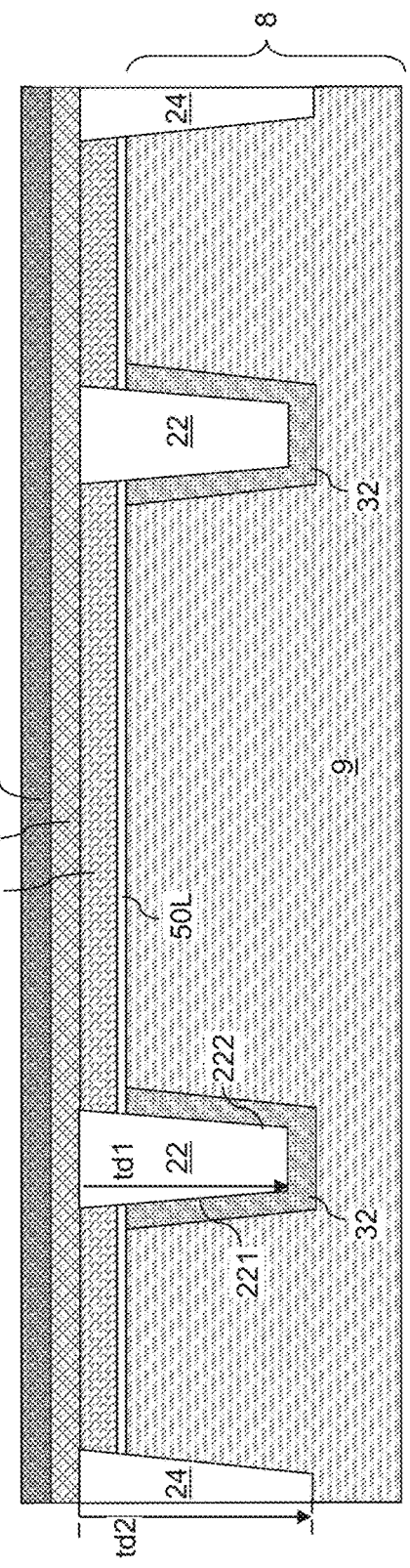
FIG. 7B
FIG. 7A

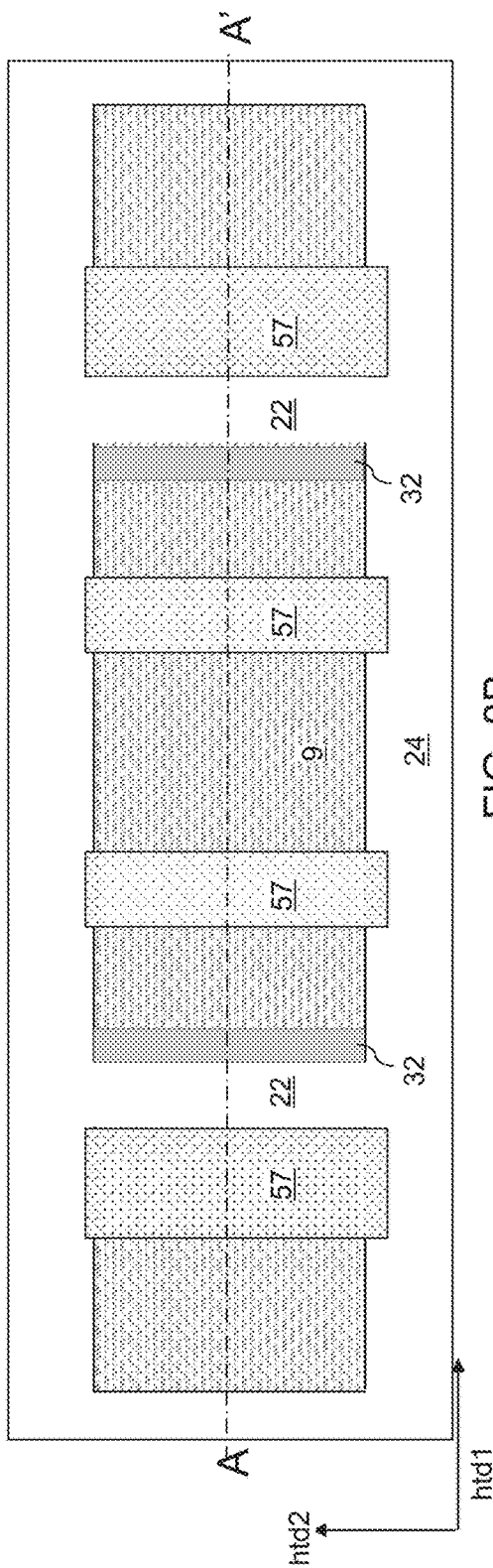
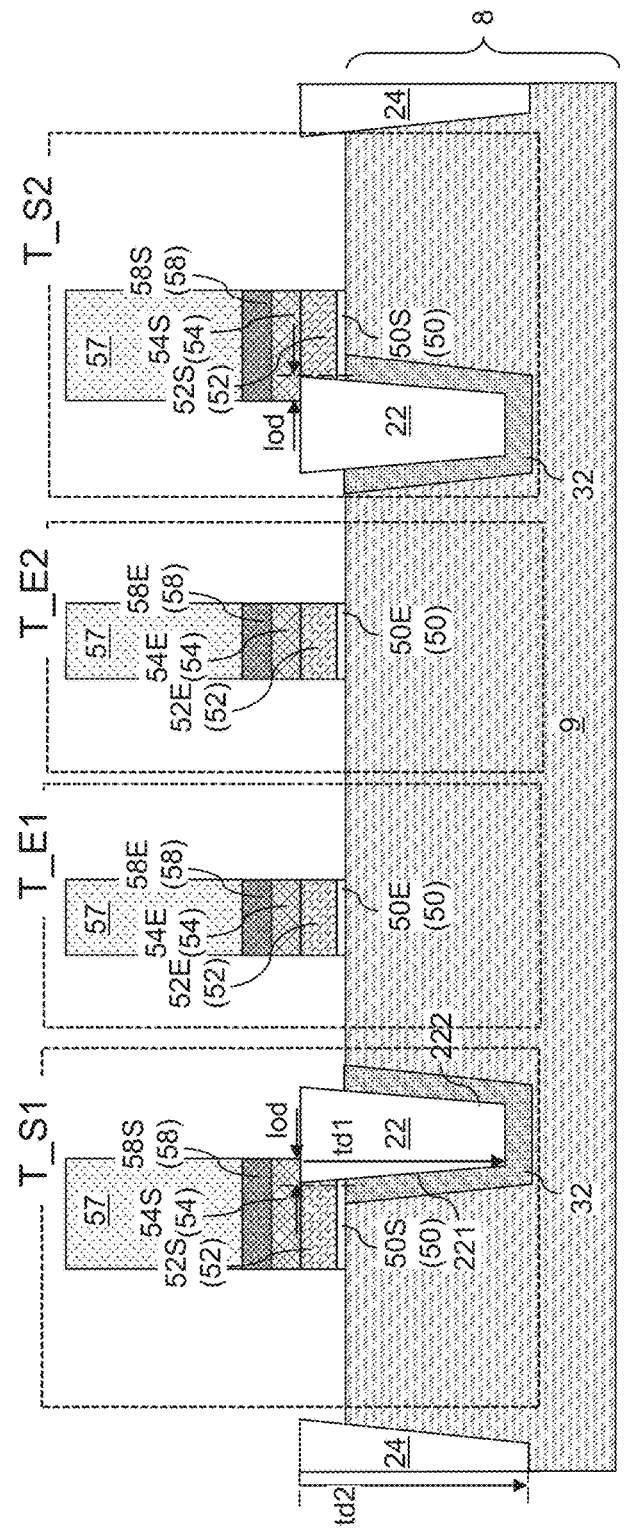
FIG. 8B
FIG. 8A

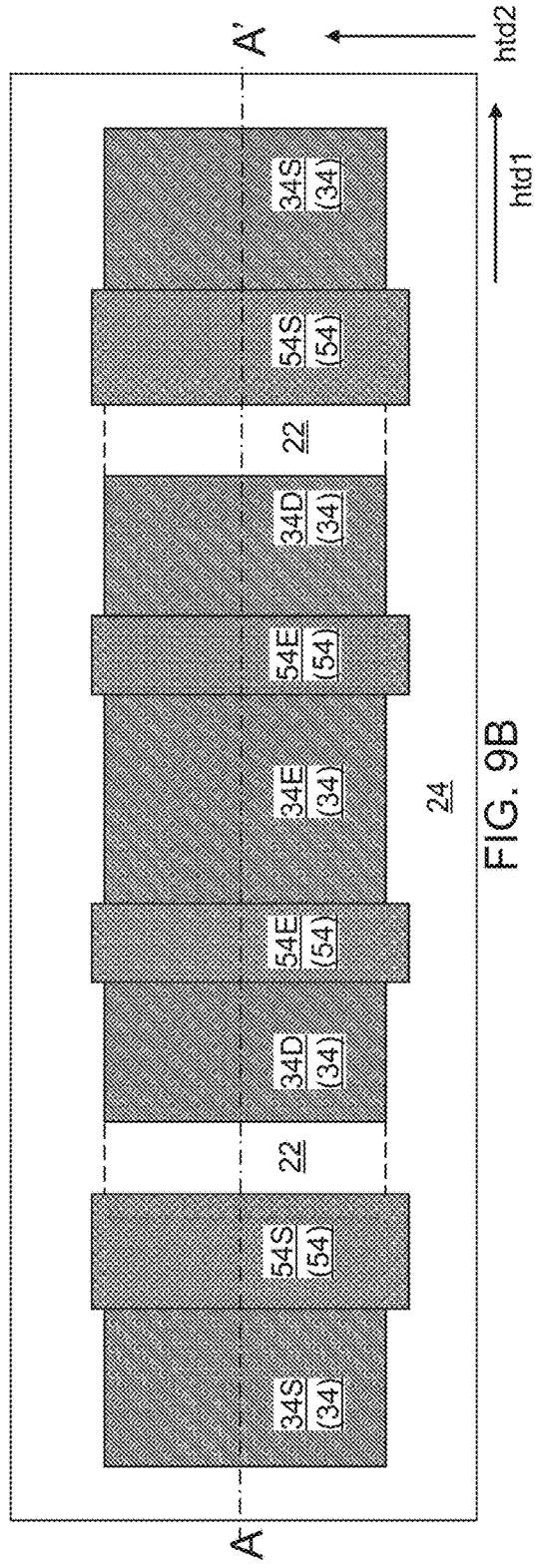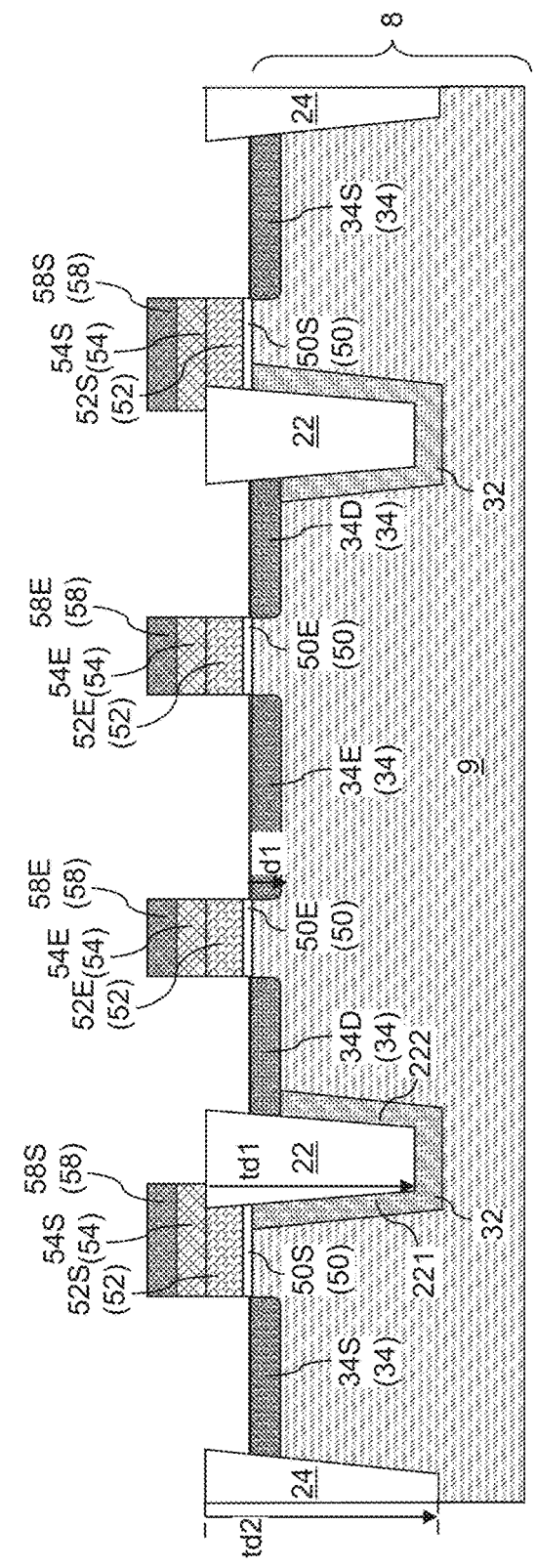

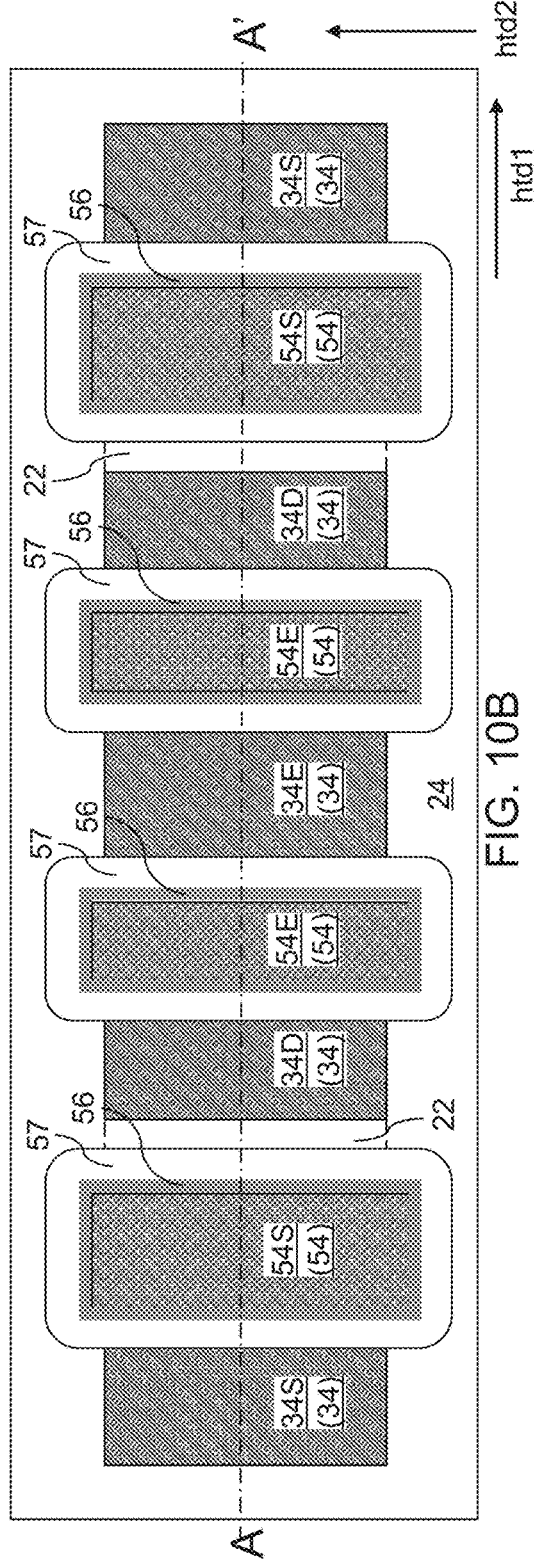
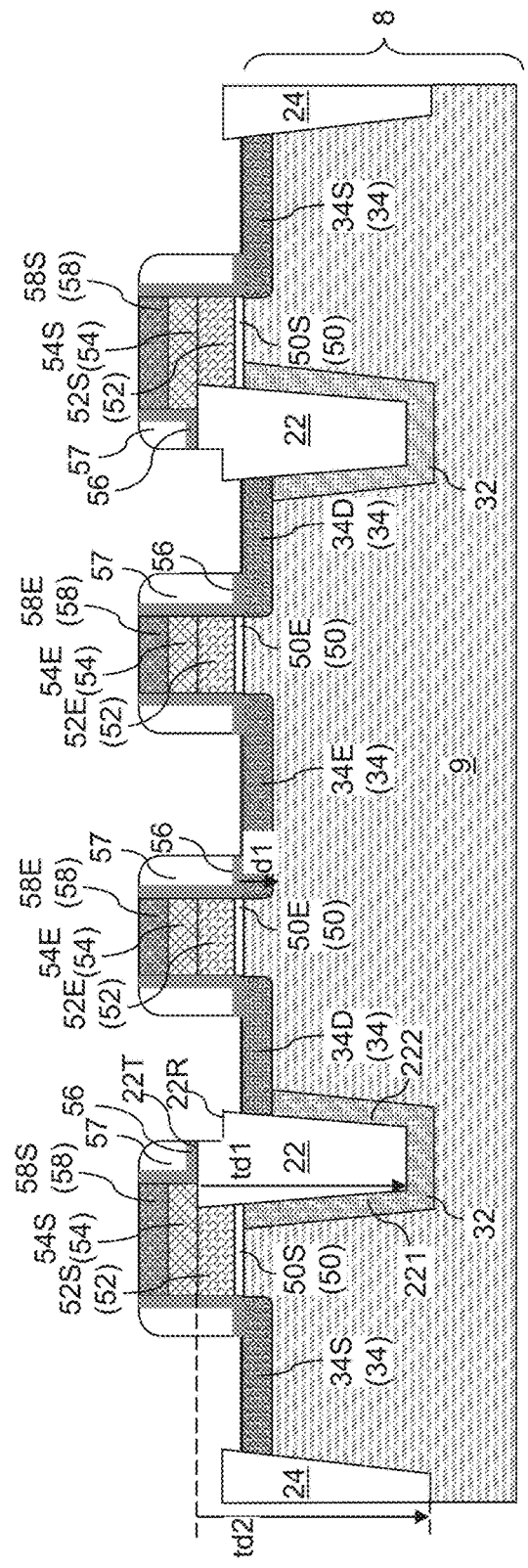

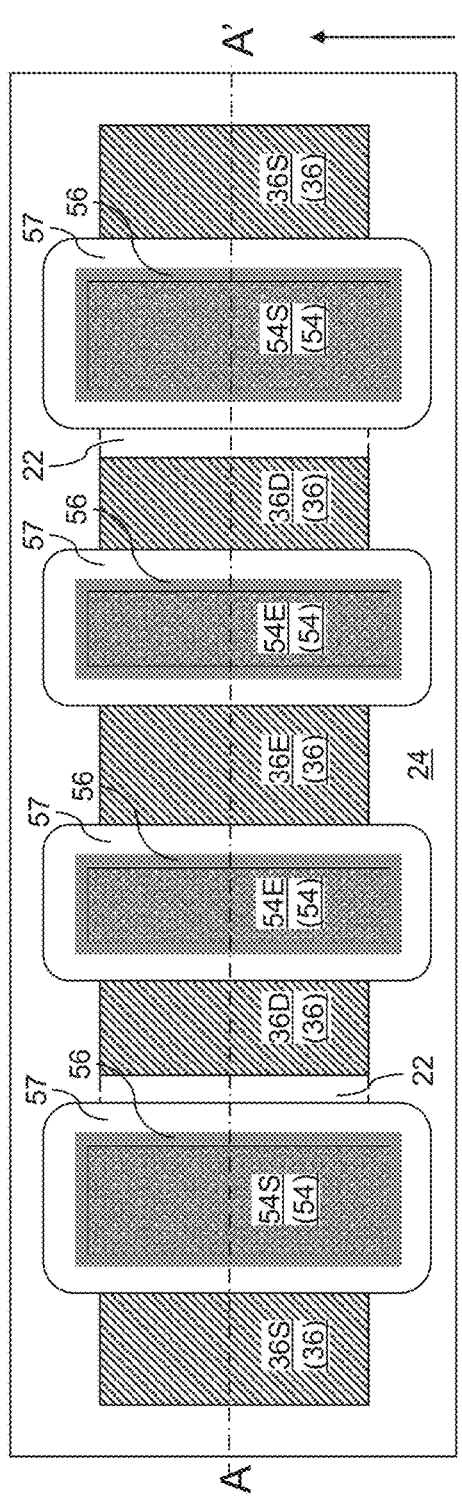
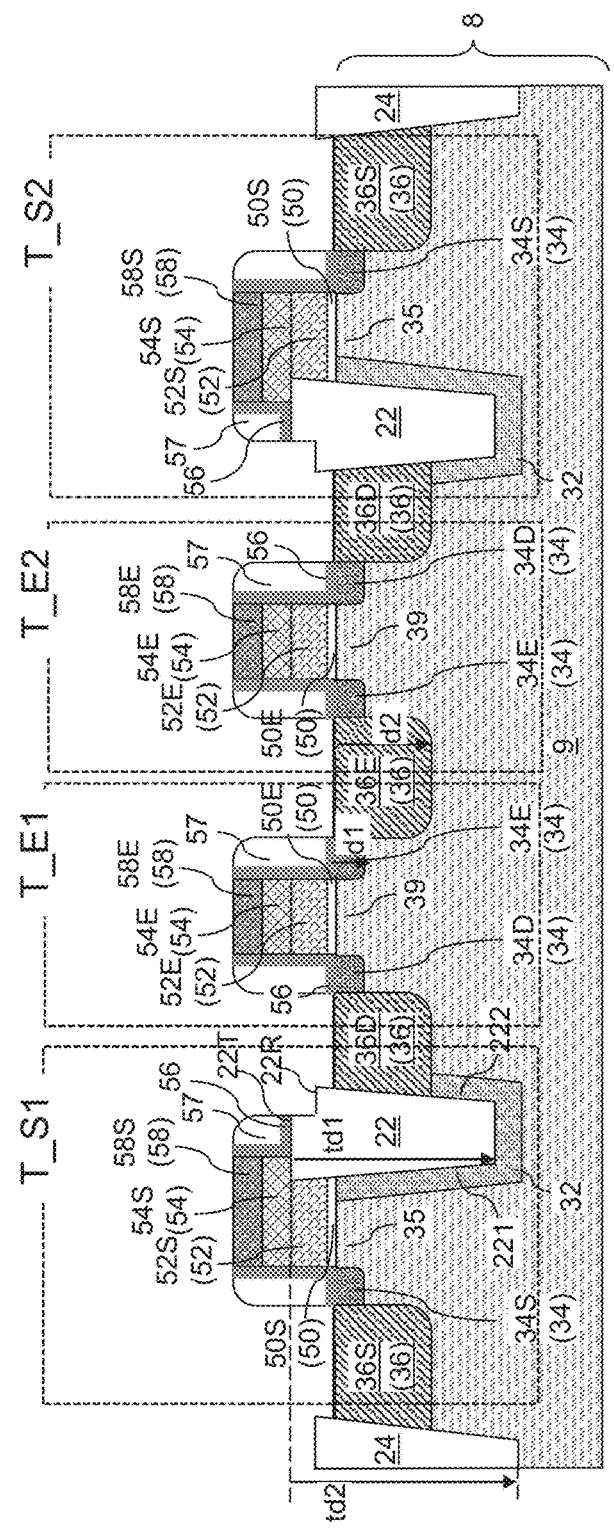
FIG. 11B
FIG. 11A

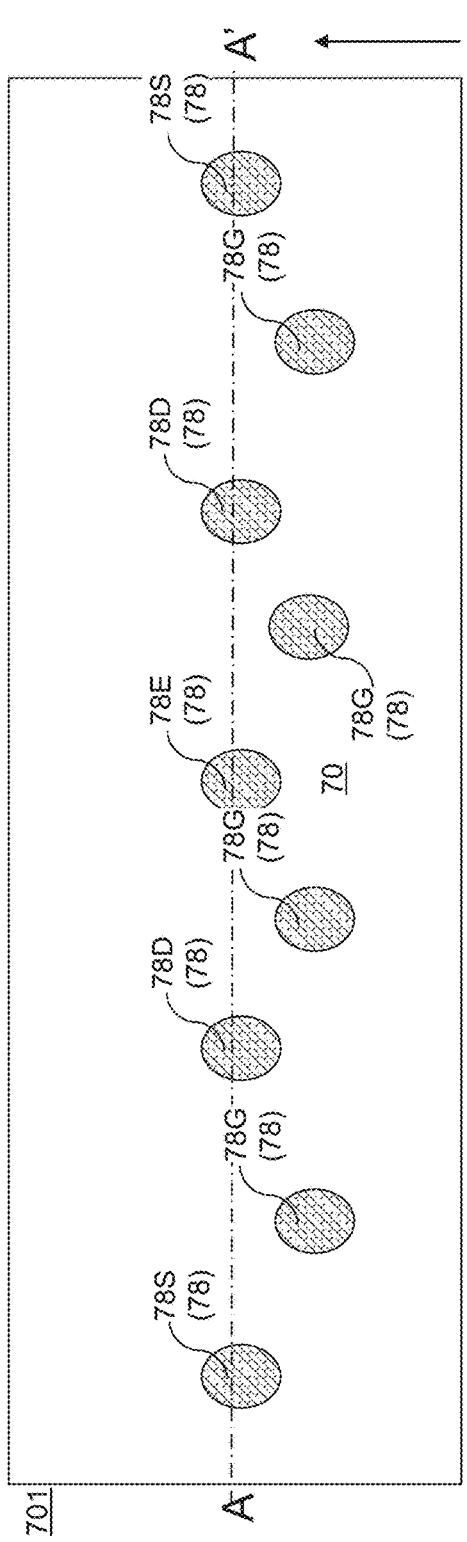
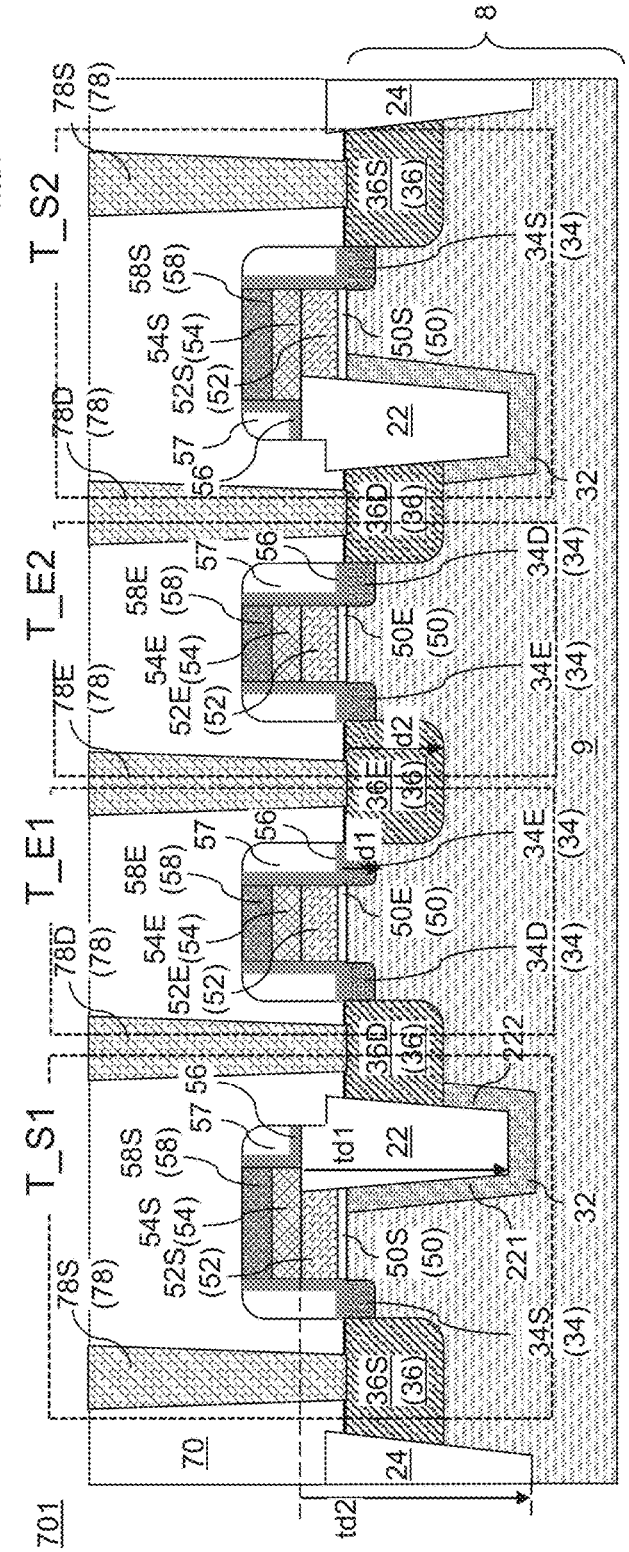
FIG. 12B
FIG. 12A

FIELD EFFECT TRANSISTORS HAVING CONCAVE DRAIN EXTENSION REGION AND METHOD OF MAKING THE SAME

FIELD

The present disclosure relates generally to the field of semiconductor devices, and particularly to field effect transistors having concave drain extension region and methods of making the same.

BACKGROUND

A three-dimensional NAND stacked memory device can be formed from an alternating stack of insulating materials and word lines. Memory openings are formed through the alternating stack, and are filled with memory stack structures, each of which includes a memory film and a vertical semiconductor channel.

SUMMARY

According to an aspect of the present disclosure, a semiconductor structure comprising a first field effect transistor is provided. The first field effect transistor comprises: a first source region embedded in a semiconductor material layer that has a doping of a first conductivity type, wherein the first source region has a doping of a second conductivity type that is an opposite of the first conductivity type; a drain region embedded in the semiconductor material layer and having a doping of the second conductivity type and laterally spaced from the first source region by a first semiconductor channel region along a first horizontal direction; a first gate stack comprising a first gate dielectric and a first gate electrode disposed over the first semiconductor channel region; a first shallow trench isolation portion embedded in an upper portion of the semiconductor material layer and contacting the drain region and the first gate stack; and a concave drain extension region having a doping of the second conductivity type continuously extending underneath the first shallow trench isolation portion from a bottom surface of the first gate dielectric to a bottom surface of the drain region.

According to another aspect of the present disclosure, a method of forming a semiconductor structure is provided, which comprises: forming a first shallow trench in an upper portion of a semiconductor material layer having a doping of a first conductivity type; forming a concave drain extension region having a doping of a second conductivity type that is an opposite of the first conductivity type in a portion of the semiconductor material layer around the first shallow trench; forming a first shallow trench isolation portion in the first shallow trench; forming a first gate stack including a first gate dielectric and a first gate electrode over the semiconductor material layer and on the first shallow trench isolation portion; and forming a first source region and a drain region in the semiconductor material layer, wherein the drain region is formed directly on the first shallow trench isolation portion and the first source region is laterally spaced from the first shallow trench isolation portion.

BRIEF DESCRIPTION OF THE DRAWINGS

FIG. 1A is a vertical cross-sectional view of an exemplary structure after formation of a gate dielectric layer, a first gate electrode material layer, and a hard mask layer according to an embodiment of the present disclosure.

FIG. 1B is a top-down view of the exemplary structure of FIG. 1A. The vertical plane B-B' is the plane of the vertical cross-sectional view of FIG. 1A.

FIG. 3A is a vertical cross-sectional view of an exemplary structure after removal of the first photoresist layer according to an embodiment of the present disclosure.

FIG. 3B is a top-down view of the exemplary structure of FIG. 3A. The vertical plane B-B' is the plane of the vertical cross-sectional view of FIG. 3A.

FIG. 4A is a vertical cross-sectional view of an exemplary structure after formation of a concave drain extension region according to an embodiment of the present disclosure.

FIG. 4B is a top-down view of the exemplary structure of FIG. 4A. The vertical plane B-B' is the plane of the vertical cross-sectional view of FIG. 4A.

FIG. 6A is a vertical cross-sectional view of an exemplary structure after formation of a shallow trench isolation structure comprising drain-extension shallow trench isolation portions and peripheral shallow trench isolation portions according to an embodiment of the present disclosure.

FIG. 6B is a top-down view of the exemplary structure of FIG. 6A. The vertical plane B-B' is the plane of the vertical cross-sectional view of FIG. 6A.

FIG. 7A is a vertical cross-sectional view of an exemplary structure after formation of second gate electrode material layer and a gate cap dielectric layer according to an embodiment of the present disclosure.

FIG. 7B is a top-down view of the exemplary structure of FIG. 7A. The vertical plane B-B' is the plane of the vertical cross-sectional view of FIG. 7A.

FIG. 8A is a vertical cross-sectional view of an exemplary structure after formation of gate stacks according to an embodiment of the present disclosure.

FIG. 8B is a top-down view of the exemplary structure of FIG. 8A. The vertical plane B-B' is the plane of the vertical cross-sectional view of FIG. 8A.

FIG. 9A is a vertical cross-sectional view of an exemplary structure after formation of planar extension regions according to an embodiment of the present disclosure.

FIG. 9B is a top-down view of the exemplary structure of FIG. 9A. The vertical plane B-B' is the plane of the vertical cross-sectional view of FIG. 9A.

FIG. 10A is a vertical cross-sectional view of an exemplary structure after formation of dielectric gate spacers and collateral recessing of portions of the shallow trench isolation structure according to an embodiment of the present disclosure.

FIG. 10B is a top-down view of the exemplary structure of FIG. 10A. The vertical plane B-B' is the plane of the vertical cross-sectional view of FIG. 10A.

FIG. 11A is a vertical cross-sectional view of an exemplary structure after formation of deep source/drain regions according to an embodiment of the present disclosure.

FIG. 11B is a top-down view of the exemplary structure of FIG. 11A. The vertical plane B-B' is the plane of the vertical cross-sectional view of FIG. 11A.

FIG. 12A is a vertical cross-sectional view of an exemplary structure after formation of a contact-level dielectric layer and contact via structures according to an embodiment of the present disclosure.

FIG. 12B is a top-down view of the exemplary structure of FIG. 12A. The vertical plane B-B' is the plane of the vertical cross-sectional view of FIG. 12A.

DETAILED DESCRIPTION

Figure 2B:
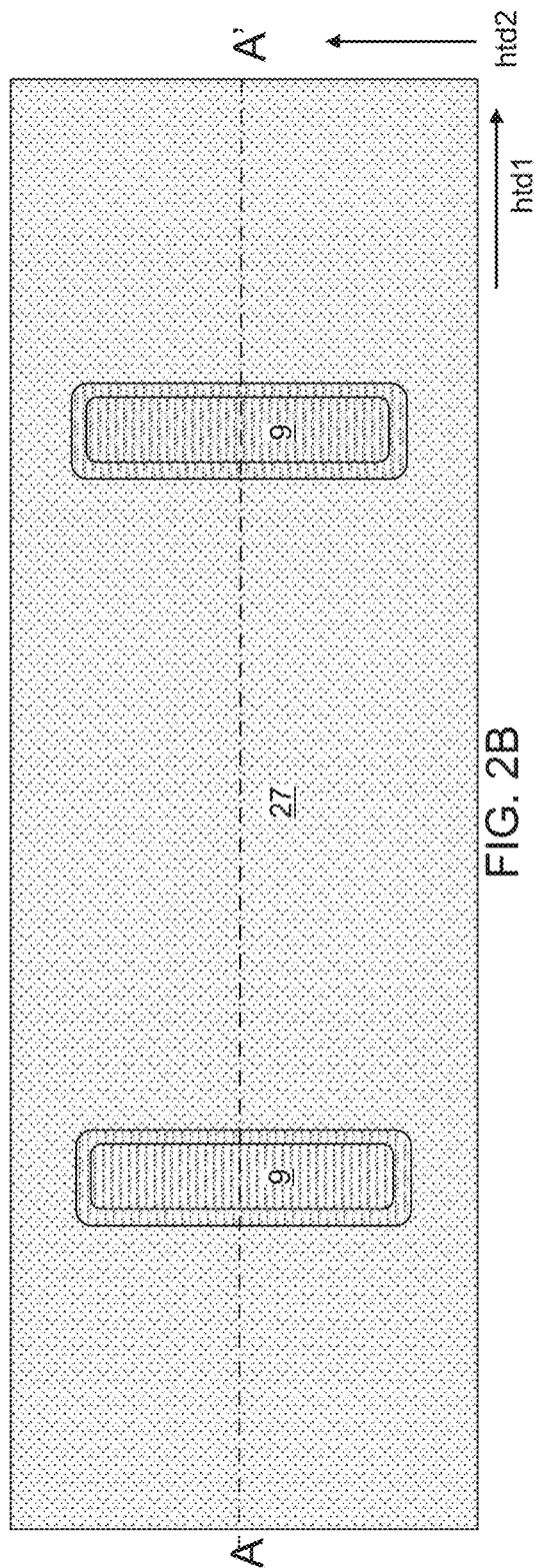
FIG. 2B is a top-down view of the exemplary structure of FIG. 2A. The vertical plane B-B' is the plane of the vertical cross-sectional view of FIG. 2A.

As discussed above, the embodiments of the present disclosure are directed to field effect transistors having a concave drain extension region and methods of making the same, the various aspects of which are discussed herein in detail. The concave drain extension region may extend under a shallow trench isolation (STI) region.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Referring to FIGS. 1A and 1B, an exemplary structure according to an embodiment of the present disclosure comprises a substrate 8 that includes a semiconductor material layer 9. As such, the semiconductor material layer 9 may comprise a top portion of or a doped well located in bulk semiconductor substrate or a top semiconductor layer of a silicon on insulator (SOI) substrate. In one embodiment, the semiconductor material layer 9 can have a doping of a first conductivity type, which may be p-type or n-type. In one embodiment, the semiconductor material layer 9 can include a single crystalline semiconductor material, such as single crystalline silicon. The substrate 8 may comprise a commercially available single crystalline silicon wafer having a thickness in a range from 300 microns to 1 mm, or may comprise the SOI substrate including a top semiconductor layer containing a single crystalline semiconductor material. For example, the substrate 8 may comprise a single crystal silicon wafer, and the semiconductor material layer 9 may comprise a doped well in the silicon wafer, an upper portion of a doped silicon wafer, or a doped epitaxial silicon layer formed on the upper surface of the silicon wafer. In one embodiment, atomic concentration of electrical dopants of the first conductivity type in the semiconductor material layer 9 may be in a range from $1.0 \times 10^{14}/cm^3$ to $1.0 \times 10^{17}/cm^3$, although lesser and greater atomic concentrations can also be employed.

A gate dielectric layer 50L, a first gate electrode material layer 52L, and an optional hard mask layer 30 may be sequentially deposited over the top surface of the semiconductor material layer 9. The gate dielectric layer 50L comprises a gate dielectric material known in the art such as silicon oxide, silicon oxynitride, at least one dielectric metal oxide (such as aluminum oxide, hafnium oxide, lanthanum oxide, etc.), or a stack thereof. In some embodiments, the gate dielectric layer 50L may be formed employing multiple deposition steps and at least one patterning step such that the material composition and/or the thickness of the gate dielectric layer 50L vary from region to region in order to optimize performance of semiconductor devices (such as field effect transistors) to be subsequently formed. Generally, the thickness of the gate dielectric layer 50L may be in a range from 1 nm to 30 m, such as from 3 nm to 10 nm, although lesser and greater thicknesses may also be employed.

The first gate electrode material layer 52L may comprise a doped semiconductor material such as heavily doped polysilicon. The type of dopants and the dopant concentration may be optimized depending on the target range for the work function of gate electrodes to be subsequently formed. Generally, the first gate electrode material layer 52L may have p-type doping or n-type doping, and the atomic concentration of dopants in the first gate electrode material layer 52L may be in a range from $1.0 \times 10^{17}/cm^3$ to $1.0 \times 10^{20}/cm^3$, although lesser and greater atomic concentrations can also be employed. The dopants in the first gate electrode material layer 52L may be introduced by implantation or by in-situ doping. In some embodiment, the type and/or atomic concentration of dopants in the first gate electrode material layer 52L may vary from region to region in order to optimize performance of semiconductor devices (such as field effect transistors) to be subsequently formed. Alternatively, the gate electrode material layer 52L may comprise a metal or metal alloy material, such as aluminum, tungsten, titanium nitride, tungsten nitride or metal silicide. The thickness of the first gate electrode material layer 52L may be in a range from 50 nm to 300 nm, such as from 100 nm to 200 nm, although lesser and greater thicknesses may also be employed.

The hard mask layer 30 (if present) may comprise a material that may be employed as a stopping layer during a subsequent chemical mechanical polishing process. For example, the hard mask layer 30 may comprise silicon nitride. The thickness of the hard mask layer 30 may be in a range from 50 nm to 200 nm, such as from 80 nm to 150 nm, although lesser and greater thicknesses may also be employed.

Figure 2A:
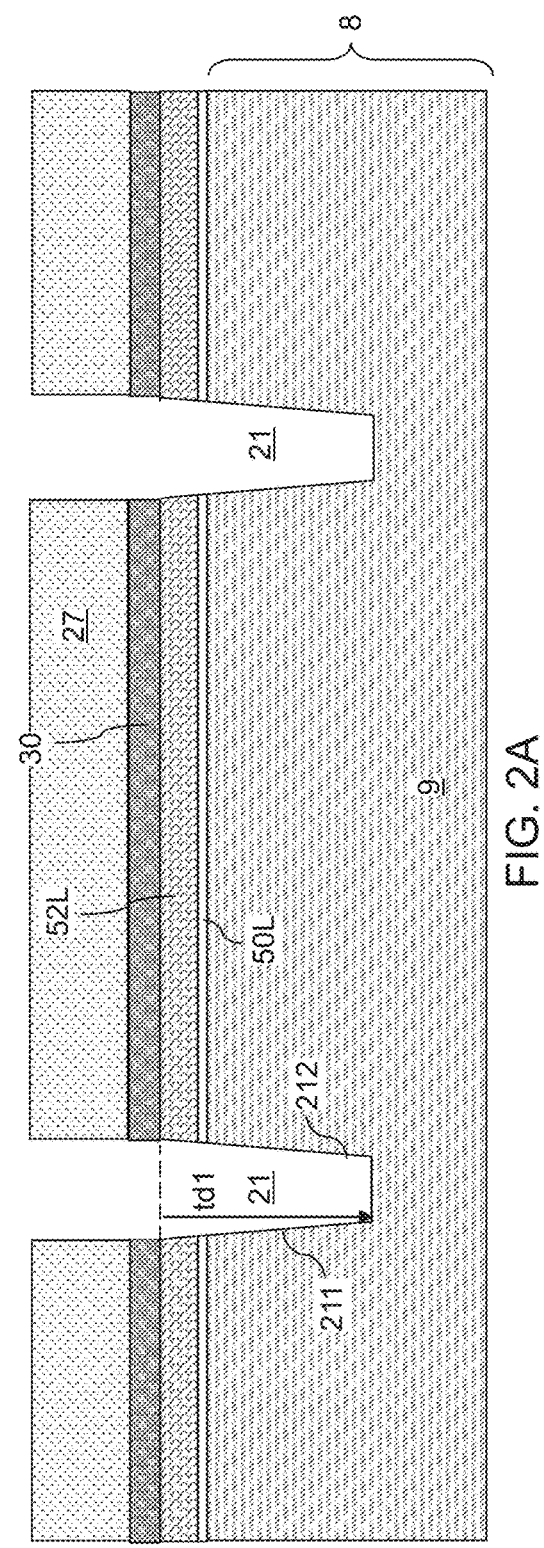
FIG. 2A is a vertical cross-sectional view of an exemplary structure after application and patterning of a first photoresist layer and formation of drain-extension shallow trenches according to an embodiment of the present disclosure.

Referring to FIGS. 2A and 2B, a first photoresist layer 27 can be applied over the top surface of the hard mask layer 30, and can be lithographically patterned to form a first pattern of openings therein. The first pattern of openings comprises a pair of line-shaped openings that are laterally spaced apart along the first horizontal direction hd1. Each line-shaped opening may laterally extend along a second horizontal direction hd2 that is perpendicular to the first horizontal direction hd1. The center-to-center distance between the pair of line-shaped openings along the first horizontal direction hd1 may be in a range from 50 nm to 1,000 nm, although lesser and greater center-to-center distances may also be employed. The length of each of the line-shaped openings along the second horizontal direction hd2 may be in a range from 10 nm to 300 nm, although lesser and greater lengths may also be employed. Each line-shaped opening may have a uniform width along the first horizontal direction hd1. The width of each line-shaped opening may be in a range from 10 nm to 200 nm, such as from 20 nm to 100 nm, although lesser and greater widths may also be employed.

A first anisotropic etch process can be performed to sequentially etch through unmasked portions of the hard mask layer 30, the first gate electrode material layer 52L, and the gate dielectric layer 50L and to etch into an upper portion of the semiconductor material layer 9. The first anisotropic etch process may comprise a set of anisotropic etch steps having a respective etch chemistry selected to effectively etch a respective material that is physically exposed underneath the openings in the first photoresist layer 27. The pattern of the line-shaped openings in the first photoresist layer 27 can be transferred through the hard mask layer 30, the first gate electrode material layer 52L, and the gate dielectric layer 50L, and into the upper portion of the semiconductor material layer 9 to form line-shaped trenches, which are herein referred to drain-extension shallow trenches or first shallow trenches 21. A concave drain extension region is subsequently formed underneath each drain-extension shallow trench (i.e., underneath each first shallow trench 21) as described below.

The physically exposed sidewalls of the hard mask layer 30, the first gate electrode material layer 52L, and the gate dielectric layer 50L around each first shallow trenches 21 may be vertical or substantially vertical, and may be vertically coincident with each other. As used herein, a first surface and a second surface are vertically coincident with each other if the second surface overlies or underlies the first surface and if there exists a common vertical or substantially vertical plane including the first surface and the second surface. Generally, each first shallow trench 21 can be formed in an upper portion of the semiconductor material layer 9 having a doping of the first conductivity type. Each first shallow trench 21 comprises a first tapered sidewall 211 and a second tapered sidewall 212 that are laterally spaced apart along the first horizontal direction hd1 and laterally extend along the second horizontal direction hd2 that is perpendicular to the first horizontal direction hd1. The taper angle of the first tapered sidewall 211 and the second tapered sidewall 212 of each first shallow trench 21, as measured from a vertical direction, may be in a range from 0 degree to 10 degrees, such as from 1 degrees to 5 degrees, although lesser and greater taper angles may also be employed. The first trench depth td1 of the bottom surface of each first shallow trench 21, as measured from a horizontal plane including an interface between the first gate electrode material layer 52L and the hard mask layer 30, may be in a range from 100 nm to 600 nm, such as from 200 nm to 400 nm, although lesser and greater first trench depths td1 may also be employed.

Referring to FIGS. 3A and 3B, the first photoresist layer 27 may be removed selective to the hard mask layer 30, the first gate electrode material layer 52L, the gate dielectric layer 50L, and the semiconductor material layer 9, for example, by ashing.

Referring to FIGS. 4A and 4B, a concave drain extension region 32 can be formed underneath each first shallow trench 21 by implantation of dopants of a second conductivity type. The second conductivity type is the opposite of the first conductivity type. For example, if the first conductivity type is p-type, then the second conductivity type is n-type, and vice versa. Each concave drain extension region 32 is formed in a surface portion of the semiconductor material layer 9 that is located around a respective first shallow trench 21. As used herein, a concave drain extension region 32 includes a peripheral top surface 32P which is located above (e.g., closer to the first gate electrode material layer 52L than) a middle top surface 32M. The peripheral top surface 32P may surround the middle top surface 32M, as shown in FIG. 4B. The top peripheral surface 32P is located on the sides of the first shallow trench 21, while the top middle surface 32M is located below the bottom surface of the first shallow trench 21, as shown in FIG. 4A.

The dopants of the second conductivity type may be implanted into the surface portions of the semiconductor material layer 9 that underlie the first shallow trenches 21 by an angled ion implantation process in which ions of the dopants of the second conductivity type impinge with a tilt angle along the first horizontal direction hd1 with respect to the vertical direction. The magnitude of the tilt angle may be in a range from 3 degrees to 30 degrees, such as from 6 degrees to 20 degrees, The magnitude of the tilt angle may be determined by the aspect ratio (i.e., a depth-to-width ratio) of the first shallow trenches 21, and may be selected to maximize the dose of the dopants of the second conductivity type that are implanted into the surface portions of the semiconductor material layer 9.

In an illustrative example, the atomic concentration of dopants of the second conductivity type in the concave drain extension regions 32 may be in a range from $1.0 \times 10^{16}/cm^3$ to $1.0 \times 10^{20}/cm^3$, such as from $1.0 \times 10^{17}/cm^3$ to $3.0 \times 10^{19}/cm^3$, although lesser and greater atomic concentrations can also be employed. A p-n junction (321, 322, 323) can be formed between each concave drain extension region 32 and the remaining portion of the semiconductor material layer 9. Each p-n junction (321, 322, 323) may comprise a first p-n junction segment 321 that is parallel to the first tapered sidewall 211 of a first shallow trench 21, a second p-n junction segment 322 that is parallel to the second tapered sidewall 212 of the first shallow trench 21, and a third p-n junction segment 323 that underlies the bottom surface of the first shallow trench 21. The lateral thickness of a concave drain extension region 32, as measured between a first p-n junction segment 321 and a first tapered sidewall 211 or as measured between a second p-n junction segment 322 and a second tapered sidewall 212, may be in a range from 5 nm to 100 nm, such as from 10 nm to 50 nm, although lesser and greater lateral thicknesses may also be employed. A vertical thickness of a concave drain extension region 32, as measured between a third p-n junction segment 323 and a bottom surface of an overlying first shallow trench 21, may be in a range from 5 nm to 100 nm, such as from 10 nm to 50 nm, although lesser and greater vertical thicknesses may also be employed.

Figure 5B:
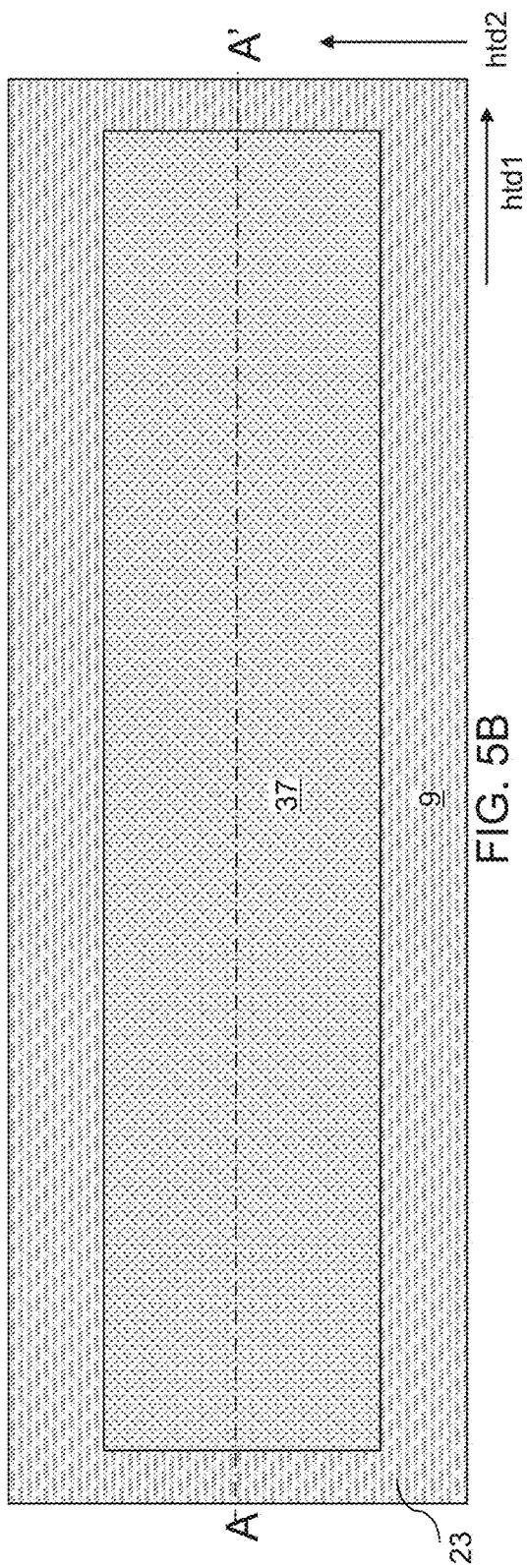
FIG. 5B is a top-down view of the exemplary structure of FIG. 5A. The vertical plane B-B' is the plane of the vertical cross-sectional view of FIG. 5A.
Figure 5A:
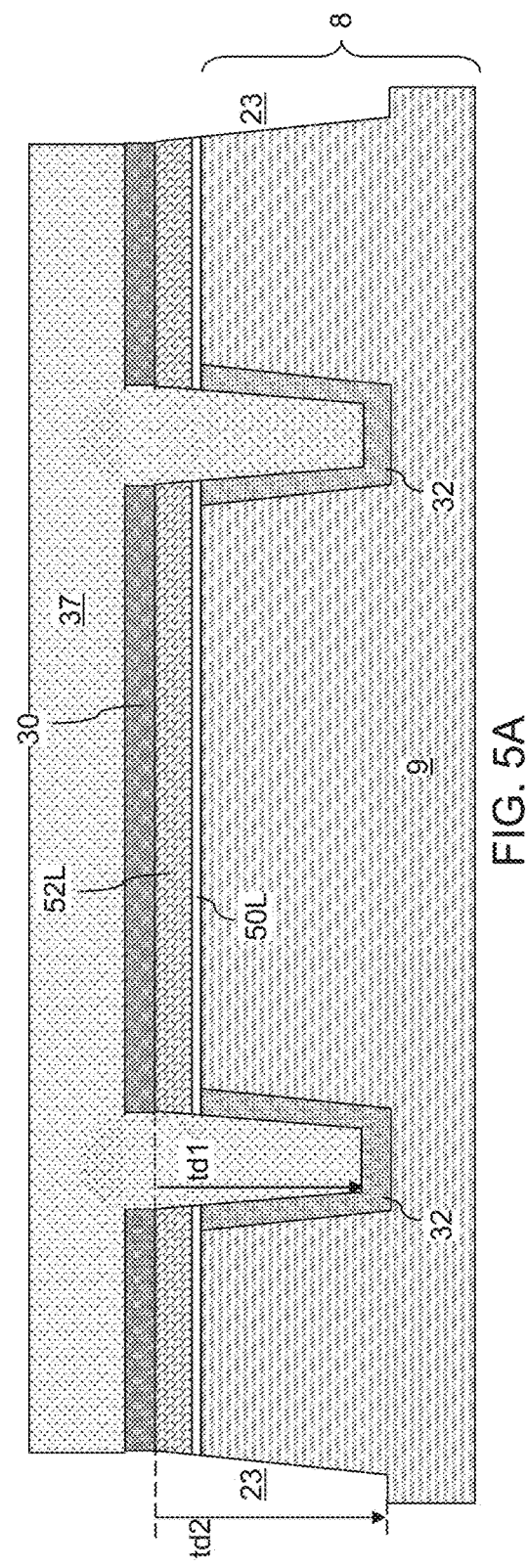
FIG. 5A is a vertical cross-sectional view of an exemplary structure after application and patterning of a second photoresist layer and formation of peripheral shallow trenches according to an embodiment of the present disclosure.

Referring to FIGS. 5A and 5B, a second photoresist layer 37 can be applied over the top surface of the hard mask layer 30 and in the first shallow trenches 21, and can be lithographically patterned to form a second pattern of openings therein. The second pattern of openings comprises a frame-shaped opening that laterally surrounds a device area (hereafter referred to an active area) in which a set of field effect transistors is to be subsequently formed. In one embodiment, the active area may have a rectangular shape with a pair of lengthwise edges laterally extending along the first horizontal direction hd1 and a pair of widthwise edges laterally extending along the second horizontal direction hd2. The inner periphery of the frame-shaped opening in the second pattern may coincide with the periphery of the active area. In one embodiment, the shape of the active area can be selected such that each lengthwise edge of the active area intersects peripheral portions of the pair of first shallow trenches 21. Thus, a predominant portion (which may be over 90% and/or over 95% and/or over 98%) of the area of each first shallow trench 21 has an areal overlap with the active region. In an illustrative example, the lengthwise edges of the active area (i.e., the lengthwise edges of a rectangular inner periphery of the frame-shaped opening in the second photoresist layer 37) may be in a range from 100 nm to 3,000 nm, although lesser and greater center-to-center distances may also be employed. The widthwise edges of the active area (i.e., the widthwise edges of the rectangular inner periphery of the frame-shaped opening in the second photoresist layer 37) may be in a range from 10 nm to 300 nm, although lesser and greater widths may also be employed.

A second anisotropic etch process can be performed to sequentially etch through unmasked portions of the hard mask layer 30, the first gate electrode material layer 52L, and the gate dielectric layer 50L and to etch into an upper portion of the semiconductor material layer 9. The second anisotropic etch process may comprise a set of anisotropic etch steps having a respective etch chemistry selected to effectively etch a respective material that is physically exposed underneath the openings in the second photoresist layer 37. The pattern of the frame-shaped openings in the second photoresist layer 37 can be transferred through the hard mask layer 30, the first gate electrode material layer 52L, and the gate dielectric layer 50L, and into the upper portion of the semiconductor material layer 9 to form frame-shaped trenches, which are herein referred to peripheral shallow trenches or second shallow trenches 23. Each second shallow trench 23 laterally surrounds a respective active area, and may be adjoined to a pair of first shallow trenches 21.

The physically exposed sidewalls of the hard mask layer 30, the first gate electrode material layer 52L, and the gate dielectric layer 50L around each second shallow trenches 23 may be vertical or substantially vertical, and may be vertically coincident among one another. Generally, each second shallow trench 23 can be formed in an upper portion of the semiconductor material layer 9 having a doping of the first conductivity type. Each second shallow trench 23 may comprise tapered sidewalls. The taper angle of the tapered sidewalls of the second shallow trench 23, as measured from a vertical direction, may be in a range from 0 degree to 10 degrees, such as from 1 degrees to 5 degrees, although lesser and greater taper angles may also be employed. The second trench depth td2 of the bottom surface of each second shallow trench 23, as measured from a horizontal plane including an interface between the first gate electrode material layer 52L and the hard mask layer 30, may be in a range from 150 nm to 1,000 nm, such as from 250 nm to 600 nm, although lesser and greater second trench depths td2 may also be employed. In one embodiment, the second trench depth td2 may be the same as or may be greater than the first trench depth td1. Generally, the first trench depth td1 may be determined based on device characteristics such as the effective length of a concave drain extension region 32 within a field effect transistor, while the second trench depth td2 may be determined based on the requirements of electrical device isolation. Thus, an optimal value for the first trench depth td1 may be less than the optimal value for the second trench depth td2, which may be as large as possible within the allowed processing capabilities for etching the second shallow trenches 23 (which can be primarily determined by the etch depth of the second shallow trenches 23).

Referring to FIGS. 6A and 6B, the second photoresist layer 37 can be removed, for example, by ashing. A dielectric fill material, such as undoped silicate glass (i.e., silicon oxide), can be conformally deposited in the first shallow trenches 21 and the second shallow trench 23 and over the hard mask layer 30. A reflow process may be optionally performed to enhance the gap fill characteristics of the dielectric fill material in the first shallow trenches 21 and the second shallow trench 23. The dielectric fill material can be planarized, for example, by performing a chemical mechanical polishing process. The hard mask layer 30 may be employed as a stopping layer (i.e., polish stop) for the chemical mechanical polishing process. Portions of the dielectric fill material located above the top surface of hard mask layer 30 are removed. Remaining portions of the dielectric fill material may be vertically recessed by performing an isotropic recess etch process. For example, a wet etch process employing dilute hydrofluoric acid may be employed in case the dielectric fill material comprises undoped silicate glass. The duration of the isotropic recess etch process may be selected such that top surfaces of the remaining portions of the dielectric fill material are coplanar with, or are substantially coplanar with, the interface between the first gate electrode material layer 52L and the hard mask layer 30. In an alternative embodiment, the hard mask layer 30 is omitted, and the first gate electrode material layer 52L may be employed as a stopping layer (i.e., polish stop) for the chemical mechanical polishing process. In this alternative embodiment, the vertical recess etch is omitted.

A shallow trench isolation structure (22, 24) can be formed in the first shallow trenches 21 and in the second shallow trench 23. The shallow trench isolation structure (22, 24) comprises a pair of first shallow trench isolation portions 22 that fill a pair of first shallow trenches 21, and a peripheral shallow trench isolation portion 24 (which is also referred to as a second shallow trench isolation portion) that fills the second shallow trench 23. The shallow trench isolation structure (22, 24) is embedded within an upper portion of the semiconductor material layer 9.

In one embodiment, each first shallow trench isolation portion 22 contains a first tapered sidewall 221 extending straight from a topmost surface of the first shallow trench isolation portion 22 to a bottom surface of the first shallow trench isolation portion 22, and a second tapered sidewall 222 extending straight from the topmost surface of the first shallow trench isolation portion 22 to the bottom surface of the first shallow trench isolation portion 22.

Referring to FIGS. 7A and 7B, the hard mask layer 30 (if present) can be removed selective to the shallow trench isolation structure (22, 24) and the first gate electrode material layer 52L. For example, if the hard mask layer 30 comprises silicon nitride, a wet etch process employing hot phosphoric acid may be performed to remove the hard mask layer 30 selective to the shallow trench isolation structure (22, 24) and the first gate electrode material layer 52L.

A second gate electrode material layer 54L and a gate cap dielectric layer 58L can be subsequently deposited. The second gate electrode material layer 54L comprises a high-conductivity material, such as a metallic material. For example, the second gate electrode material layer 54L may comprise an elemental metal (e.g., Al, Ti, W, Ti, Ta, etc.), an intermetallic alloy (e.g., a metal silicide, such as titanium silicide or tungsten silicide), or a conductive metallic compound (e.g., TiN or WN). In an illustrative example, the second gate electrode material layer 54L may comprise, and/or consist essentially of, at least one transition metal, such as tungsten. The second gate electrode material layer 54L may be deposited by a conformal deposition process (such as a chemical vapor deposition process) or a non-conformal deposition process (such as a physical vapor deposition process). The thickness of the second gate electrode material layer 54L may be in a range from 30 nm to 200 nm, such as from 60 nm to 120 nm, although lesser and greater thicknesses may also be employed.

The gate cap dielectric layer 58L comprises a dielectric material that may be subsequently employed as an etch stop layer. For example, the gate cap dielectric layer 58L may comprise, and/or consist essentially of, silicon nitride, silicon carbide nitride, or a dielectric metal oxide (such as aluminum oxide, titanium oxide, lanthanum oxide, etc.). The gate cap dielectric layer 58L may be deposited, for example, by chemical vapor deposition. The thickness of the gate cap dielectric layer 58L may be in a range from 10 nm to 100 nm, such as from 20 nm to 60 nm, although lesser and greater thicknesses may also be employed.

Referring to FIGS. 8A and 8B, a third photoresist layer 57 can be applied over the gate cap dielectric layer 58L, and can be lithographically patterned into shapes of gate electrodes to be subsequently formed. In one embodiment, the third photoresist layer 57 may be patterned to provide four gate electrodes for four field effect transistors within the active region. In this case, the patterned third photoresist layer 57 may comprise first patterns that overlie a peripheral region of a respective first shallow trench isolation portion 22 and an adjacent portion of a top surface of the semiconductor material layer 9, and second patterns that are laterally spaced from the first patterns and overlie a respective portion of the top surface of semiconductor material layer that is located between the first shallow trench isolation portions 22. The four field effect transistors to be subsequently formed may comprise a pair of sense-amplifier-connection field effect transistors (T_S1, T_S2) and a pair of erase-voltage-connection field effect transistors (T_E1, T_E2) that can be connected to a pair of bit lines of a memory array. In this case, a sense-amplifier-connection field effect transistor T_S1 and an erase-voltage-connection field effect transistor T_E1 may share a drain region that is electrically connected to a bit line, a source region of the sense-amplifier-connection field effect transistor T_S1 can be connected to a sense amplifier input node, and a source region of the erase-voltage-connection field effect transistor T_E1 can be connected to an erase voltage supply circuit upon completion of formation of the field effect transistors, as will be described in more detail below with respect to FIGS. 13 and 14.

The first patterns and the second patterns within the patterned third photoresist layer 57 can be transferred through the gate cap dielectric layer 58L, the second gate electrode material layer 54L, the first gate electrode material layer 52L, and the gate dielectric layer 50L by performing an anisotropic etch process that employs the patterned third photoresist layer 57 as an etch mask. The anisotropic etch process may comprise a first anisotropic etch step that etches the material of the gate cap dielectric layer 58L, a second anisotropic etch step that etches the material of the second gate electrode material layer 54L selective to the material of the shallow trench isolation structure (22, 24), a third anisotropic etch step that etches the material of the first gate electrode material layer 52L selective to the material of the shallow trench isolation structure (22, 24), and a fourth anisotropic etch process that etches the material of the gate dielectric layer 50L selective to the material of the semiconductor material layer 9.

A first gate stack (50S, 52S, 54S, 58S) of each sense-amplifier-connection field effect transistor (T_S1, T_S2) is formed underneath each first pattern of the patterned third photoresist layer 57, and a second gate stack (50E, 52E, 54E, 58E) of each erase-voltage-connection field effect transistor (T_E1, T_E2) is formed underneath each second pattern of the patterned third photoresist layer 57. Each first gate stack (50S, 52S, 54S, 58S) may comprise a first gate dielectric 50S, a first gate electrode (52S, 54S), and a first gate cap dielectric 58S. Each second gate stack (50E, 52E, 54E, 58E) may comprise a second gate dielectric 50E, a second gate electrode (52E, 54E), and a second gate cap dielectric 58E. Each first gate electrode (52S, 54S) may comprise a first semiconductor gate electrode portion 52S and a first metallic gate electrode portion 54S. Each second gate electrode (52E, 54E) may comprise a second semiconductor gate electrode portion 52E and a second metallic gate electrode portion 54E. The first gate dielectrics 50S and the second gate dielectrics 50E are collectively referred to as gate dielectrics 50. The first semiconductor gate electrode portions 52S and the second semiconductor gate electrode portions 52E are collectively referred to as semiconductor gate electrode portions 52. The first metallic gate electrode portions 54S and the second metallic gate electrode portions 54E are collectively referred to as metallic gate electrode portions 54. The first gate cap dielectrics 58S and the second gate cap dielectrics 58E are collectively referred to as gate cap dielectrics 58.

Each first gate stack (50S, 52S, 54S, 58S) may comprise a first sidewall that overlies and is adjoined to a top surface of the semiconductor material layer 9, and a second sidewall that overlies, and is adjoined to, a top surface of a first shallow trench isolation portion 22. In one embodiment, the first tapered sidewall 221 of the first shallow trench isolation portion 22 may comprise a first surface segment in contact with a tapered sidewall segment of a first gate electrode (52S, 54S), a second surface segment in contact with a sidewall of the first gate dielectric 50S, and a third surface segment in contact with a tapered sidewall of a concave drain extension region 32. In one embodiment, the second tapered sidewall 222 of the first shallow trench isolation portion 22 may comprise a physically exposed sidewall segment, and a sidewall segment in contact with the concave drain extension region 32.

In one embodiment, each first gate stack (50S, 52S, 54S, 58S) may be formed directly on a top surface of a respective concave drain extension region 32 and directly on a first segment of a top surface of a respective first shallow trench isolation portion 22. In one embodiment, a bottom edge of a straight sidewall (which is a segment of a second sidewall of a first gate stack (50S, 52S, 54S, 58S)) of each first gate electrode (52S, 54S) contacts a top surface of a first shallow trench isolation portion 22, and is laterally offset from a top edge of a tapered sidewall segment of the first gate electrode (52S, 54S) (such as a tapered sidewall segment of a first semiconductor gate electrode portion 52S) by a lateral offset distance "lod" along the first horizontal direction hd1. The width along the first horizontal direction hd1 of the contact area between a bottom surface segment of a first metallic gate electrode portion 54S and the top surface of an underlying first shallow trench isolation portion 22 can be the same as the lateral offset distance lod.

A first segment of the top surface of each first shallow trench isolation portion 22 may contact a planar bottom surface segment of a first gate electrode (52S, 54S) (such as a planar bottom surface segment of a first metallic gate electrode portion 54S), and a second segment of the top surface of the first shallow trench isolation portion 22 may be physically exposed. In one embodiment, the planar bottom surface segment of the first gate electrode (52S, 54S) can be located above a horizontal plane including an interface between the first gate dielectric 50S and the first gate electrode (52S, 54S).

In one embodiment, each first gate electrode (52S, 54S) may comprise a first semiconductor gate electrode portion 52S in contact with a first gate dielectric 50S and a first surface segment of a first shallow trench isolation portion 22, and a first metallic gate electrode portion 54S in contact with a top surface of the first semiconductor gate electrode portion 52S and in contact with a first segment of a top surface of the first shallow trench isolation portion 22.

Referring to FIGS. 9A and 9B, the third photoresist layer 57 may be removed, for example, by ashing. Dopants of the second conductivity type can be implanted into surface portions of the semiconductor material layer 9 that are not masked by gate stacks (50, 52, 54, 58). Implanted surface portions of the semiconductor material layer 9 are converted into doped regions having a doping of the second conductivity type, which are herein referred to as planar extension regions 34. A predominant portion of each of the planar extension regions 34 has a uniform thickness, which can be the same across all of the planar extension regions 34. In other words, bottom surfaces of the planar extension regions 34 may be planar, and may be located at a first depth d1 from the horizontal plane including the interfaces between the semiconductor material layer 9 and the gate dielectrics 50. The uniform thickness, which is the same as the first depth d1, may be in a range from 5 nm to 100 nm, such as from 10 nm to 50 nm, although lesser and greater thicknesses may also be employed. Peripheral portions of each planar extension region 34 that are masked by an overlying gate stack (50, 52, 54, 58) may have a lesser thickness than the uniform thickness. The atomic concentration of dopants of the second conductivity type in the planar extension regions 34 may be in a range from $1.0 \times 10^{16}/cm^3$ to $2.0 \times 10^{20}/cm^3$, such as from $1.0 \times 10^{17}/cm^3$ to $6.0 \times 10^{19}/cm^3$, although lesser and greater atomic concentrations can also be employed.

The planar extension regions 34 may comprise first source extension regions 34S that are formed in an area of transistors T_S1 and T_S2 between a respective first gate stack (50S, 52S, 54S, 58S) and a peripheral shallow trench isolation portion 24, a second source extension region 34E that is formed in an area of transistors T_E1 and T_E2 between a pair of second gate stacks (50E, 52E, 54E, 58E), and planar drain extension regions 34D that are formed within areas shared by respective transistors T_S1 and T_E1 and transistors T_S2 and T_E2 and located between a respective second gate stack (50E, 52E, 54E, 58E) and a respective first shallow trench isolation portion 22. In one embodiment, a region of each planar drain extension region 34D that is formed within a portion of a concave drain extension region 32 may include dopants of the second conductivity type at a higher atomic concentration than portions of the planar drain extension regions 34D that are formed outside the volumes of the concave drain extension regions 32 as provided at the processing steps of FIGS. 4A and 4B, and than the first source extension regions 34S and the second source extension regions 34D.

Referring to FIGS. 10A and 10B, an optional inner dielectric gate spacer material layer and an outer dielectric gate spacer material layer can be conformally deposited over the substrate 8 and the gate stacks (50, 52, 54, 58). The optional inner dielectric gate spacer material layer comprises a dielectric liner material such as silicon nitride, and may have a thickness in a range from 1 nm to 20 nm, such as from 2 nm to 10 nm, although lesser and greater thicknesses may also be employed. The outer dielectric gate spacer material layer comprises at least one dielectric gate spacer material such as silicon oxide and/or organosilicate glass. The thickness of the outer dielectric gate spacer material layer may be in a range from 5 nm to 200 nm, such as from 20 nm to 100 nm, although lesser and greater thicknesses may also be employed.

An anisotropic etch (i.e., sidewall spacer etch) process can be performed to remove horizontally extending portions of the outer dielectric gate spacer material layer and the optional inner dielectric gate spacer material layer. The anisotropic etch process can etch the dielectric material(s) of the outer dielectric gate spacer material layer and the optional inner dielectric gate spacer material layer selective to the semiconductor material of the planar extension regions 34 and selective to the dielectric material of the gate cap dielectrics 58. For example, if the outer dielectric gate spacer material layer comprises silicon oxide and if the gate cap dielectrics 58 comprise silicon nitride, processing steps of the anisotropic etch process that etches horizontally extending portions of the outer dielectric gate spacer material layer may etch silicon oxide selective to silicon nitride. The terminal step of the anisotropic etch process may etch the horizontally extending portions of the optional inner dielectric gate spacer material layer, if present, or may etch the horizontally extending portions of the outer dielectric gate spacer material layer selective to the semiconductor material of the planar extension regions 34.

Each remaining portion of the optional inner dielectric gate spacer material layer, if employed, comprises an inner dielectric gate spacer 56 that laterally surrounds a respective gate stack (50, 52, 54, 58). Each remaining portion of the outer dielectric gate spacer material layer comprises an outer dielectric gate spacer 57 that laterally surrounds a respective gate stack (50, 52, 54, 58). If inner dielectric gate spacers 56 are present, then each inner dielectric gate spacer 56 may be laterally surrounded by a respective outer dielectric gate spacer 57. If inner dielectric gate spacers 56 are present, then each contiguous combination of an inner dielectric gate spacer 56 and an outer dielectric gate spacer 57 constitutes a dielectric gate spacer (56, 57). If inner dielectric gate spacers 56 are omitted, then each outer dielectric gate spacer 57 constitutes a dielectric gate spacer 57.

Portions of the shallow trench isolation structure (22, 24) that are not masked by the gate stacks (50, 52, 54, 58), inner dielectric gate spacers 56, or the outer dielectric gate spacers 57 can be collaterally vertically recessed during the anisotropic etch process. Thus, portions of the top surfaces of the shallow trench isolation structure (22, 24) that are not masked by the gate stacks (50, 52, 54, 58), inner dielectric gate spacers 56, or the outer dielectric gate spacers 57 are vertically recessed to provide a respective recessed horizonal surface segment 22R.

In one embodiment, a first segment of a topmost surface 22T (i.e., an unrecessed portion of the top surface as formed at the processing steps of FIGS. 6A and 6B) of a first shallow trench isolation portion 22 can contact a bottom surface of a first gate electrode (52S, 54S) in a first gate stack (50S, 52S, 54S, 58S) of transistors T_S1 and T_S2, and a first outer dielectric gate spacer 57 can be formed around the first gate stack (50S, 52S, 54S, 58S) over a second segment of the topmost surface 22T of the first shallow trench isolation portion and directly on a segment of a top surface of the semiconductor material layer.

A first segment of the topmost surface 22T of each first shallow trench isolation portion 22 may contact a planar bottom surface segment of a first gate electrode (52S, 54S) (such as a planar bottom surface segment of a first metallic gate electrode portion 54S), and a second segment of the topmost surface 22T of the first shallow trench isolation portion 22 may contacts a first bottom surface of a first dielectric gate spacer (56, 57) that laterally surrounds the first gate electrode (52S, 54S). In this case, the first shallow trench isolation portion 22 may comprises a vertical sidewall adjoined to an edge of the topmost surface 22T of the first shallow trench isolation portion 22 and vertically coincident with an outer sidewall of the first dielectric gate spacer (56, 57), and a recessed horizontal surface 22R that is adjoined to a bottom edge of the vertical sidewall of the first shallow trench isolation portion 22 and located above a horizontal plane including a top surface of the semiconductor material layer 9.

In one embodiment, a first shallow trench isolation portion 22 comprises a recessed horizontal surface 22R located below the topmost surface 22T of the first shallow trench isolation portion 22 and located above a horizontal plane including an interface between a first gate stack (50S, 52S, 54S, 58S) and the semiconductor material layer 9, and a second tapered sidewall extending straight from the recessed horizontal surface 22R of the first shallow trench isolation portion 22 to the bottom surface of the first shallow trench isolation portion 22 and contacting a planar drain extension region 34D and a concave drain extension region 32.

Referring to FIGS. 11A and 11B, dopants of the second conductivity type can be implanted into surface portions of the substrate 8 that are not masked by gate stacks (50, 52, 54, 58) or the dielectric gate spacers (56, 57). Implanted surface portions of the semiconductor material layer 9, the planar extension regions 34, and the concave drain extension regions 32 are converted into doped regions having a doping of the second conductivity type, which are herein referred to as deep source/drain regions 36. A predominant portion of each of the deep source/drain regions 36 has a uniform thickness, which can be the same across all of the deep source/drain regions 36. In other words, bottom surfaces of the deep source/drain regions 36 may be planar, and may be located at a second depth d2 from the horizontal plane including the interfaces between the semiconductor material layer 9 and the gate dielectrics 50. The uniform thickness, which is the same as the second depth d2, may be in a range from 30 nm to 400 nm, such as from 60 nm to 200 nm, although lesser and greater thicknesses may also be employed. Peripheral portions of each deep source/drain region 36 that are masked by an overlying dielectric gate spacer (56, 57) may have a lesser thickness than the uniform thickness. The atomic concentration of dopants of the second conductivity type in the deep source/drain regions 36 is greater than the atomic concentration of dopants of the second conductivity type in the planar extension regions 34. In one embodiment, the atomic concentration of dopants of the second conductivity type in the deep source/drain regions 36 may be in a range from $5.0 \times 10^{18}/cm^3$ to $2.0 \times 10^{21}/cm^3$, such as from $1.0 \times 10^{19}/cm^3$ to $1.0 \times 10^{21}/cm^3$, although lesser and greater atomic concentrations can also be employed.

The deep source/drain regions 36 may comprise first deep source regions 36S that are formed in an area of transistors T_S1 and T_S2 between a respective first gate stack (50S, 52S, 54S, 58S) and a peripheral shallow trench isolation portion 24, a second deep source region 36E that is formed in an area of transistors T_E1 and T_E2 between a pair of second gate stacks (50E, 52E, 54E, 58E), and deep drain regions 36D that are formed within areas between transistors {(T_S1, T_E1) and (T_S2, T_E2)} and located between a respective second gate stack (50E, 52E, 54E, 58E) and a respective first shallow trench isolation portion 22. Each contiguous combination of a first source extension region 34S and a first deep source region 36S constitutes a first source region (34S, 36S). The contiguous combination of two second source extension regions 34E and a second deep source region 36E constitutes a second source region (34E, 36E). Each contiguous combination of a planar drain extension region 34D and a deep drain region 36D constitutes a drain region (34D, 36D).

In one embodiment, each first source region (34S, 36S) comprises a first source extension region 34S having a bottom surface located at a first depth d1 from a horizontal plane including an interface between the semiconductor material layer and the first gate stack, and a first deep source region 36S having a bottom surface located at a second depth d2 from the horizontal plane that is greater than the first depth d1. In one embodiment, each drain region (34D, 36D) comprises a deep drain region 36D having a bottom surface located at the second depth d2 from the horizontal plane. In one embodiment, each concave drain extension region 32 includes dopants of the second conductivity type at a lower atomic concentration than the first source extension region 34S.

Generally, a first source region (34S, 36S) and a drain region (34D, 36D) can be formed in the semiconductor material layer 9. The drain region (34D, 36D) is formed directly in contact with the first shallow trench isolation portion 22, and the first source region (34S, 36S) is laterally spaced from the first shallow trench isolation portion 22. Each first shallow trench isolation portion 22 comprises a first tapered sidewall 221 extending straight from a topmost surface of the first shallow trench isolation portion 22 to a bottom surface of the first shallow trench isolation portion 22, and a second tapered sidewall 222 extending straight from above a horizontal plane including an interface between the semiconductor material layer 9 and the first gate stack (50S, 52S, 54s, 58S) and contacting a tapered sidewall of a drain region (34D, 36D).

In one embodiment, a pair of first field effect transistors (T_S1, T_S2) and a pair of second field effect transistors (T_E1, T_E2) can be formed in an active region. Each first field effect transistor (T_S1, T_S2) may comprise a first source region (34S, 36S) embedded in a semiconductor material layer 9 that has a doping of a first conductivity type, wherein the first source region (34S, 36S) has a doping of a second conductivity type that is an opposite of the first conductivity type; a drain region (34D, 36D) embedded in the semiconductor material layer 9 and having a doping of the second conductivity type and laterally spaced from the first source region (34S, 36S) by a first semiconductor channel region 35 of the first conductivity type along a first horizontal direction hd1; a first gate stack (50S, 52S, 54S, 58S) comprising a first gate dielectric 50S and a first gate electrode (52S, 54S) and disposed over a portion of the semiconductor material layer 9 located between the first source region (34S, 36S) and the drain region (34D, 36D); and a concave drain extension region 32 having a doping of the second conductivity type and continuously extending underneath the first shallow trench isolation portion 22 from a bottom surface of the first gate dielectric 50S to a bottom surface of the drain region (34D, 36D).

Each second field effect transistor (T_E1, T_E2) may comprise a second source region (34E, 36E) embedded in the semiconductor material layer 9 and having a doping of the second conductivity type; a second gate stack (50E, 52E, 54E, 58E) comprising a second gate dielectric 50E and a second gate electrode (52E, 54E) and disposed over a second semiconductor channel region 39 of the first conductivity type in a portion of the semiconductor material layer 9 located between the second source region (34E, 36E) and the drain region (34D, 36D), wherein a planar interface between the semiconductor material layer 9 and the second gate stack (50E, 52E, 54E, 58E) continuously extends between the second source region (34E, 36E) and the drain region (34D, 36D).

The first source regions (34S, 36S) and the concave drain extension regions 32 are located in the first field effect transistors (T_S1, T_S2). The second source region (34E, 36E) is shared between the two second field effect transistors (T_E1, T_E2). Each drain region (34D, 36D) and is shared by respective field effect transistors (T_S1, T_E1) and (T_S2, T_E2).

A peripheral shallow trench isolation portion 24 may laterally surround the first source region (34S, 36S), the drain region (34D, 36D), the first shallow trench isolation portion 22, and the second source region (34E, 36E), wherein the first shallow trench isolation portion 22. The peripheral shallow trench isolation portion 24 are connected portions of a shallow trench isolation structure (22, 24) comprising a dielectric fill material.

Referring to FIGS. 12A and 12B, a contact-level dielectric layer 70 can be formed over the substrate 8 and the field effect transistors. Contact via cavities can be formed through the contact-level dielectric layer 70 such that portions of the top surfaces of the first source regions (34S, 36S), the second source regions (34E, 36E), and the drain regions (34D, 36D) are physically exposed at the bottom of the contact via cavities. Contact via structures 78 can be formed in the contact via cavities by depositing at least one conductive material in the contact via cavities, and removing excess portions of the at least one conductive material from above the horizontal plane including the top surface of the contact-level dielectric layer 70. The contact via structures 78 may comprise first source contact via structures 78S contacting a top surface of a respective one of the first source regions (34S, 36S), second source contact via structures 78E contacting a top surface of a respective one of the second source regions (34E, 36E), drain contact via structures 78D contacting a top surface of a respective one of the drain regions (34D, 36D), and gate contact via structures 78G contacting a top surface of a respective one of the gate electrodes (52, 54). These steps form a bit line switch circuit 701.

Figure 13:
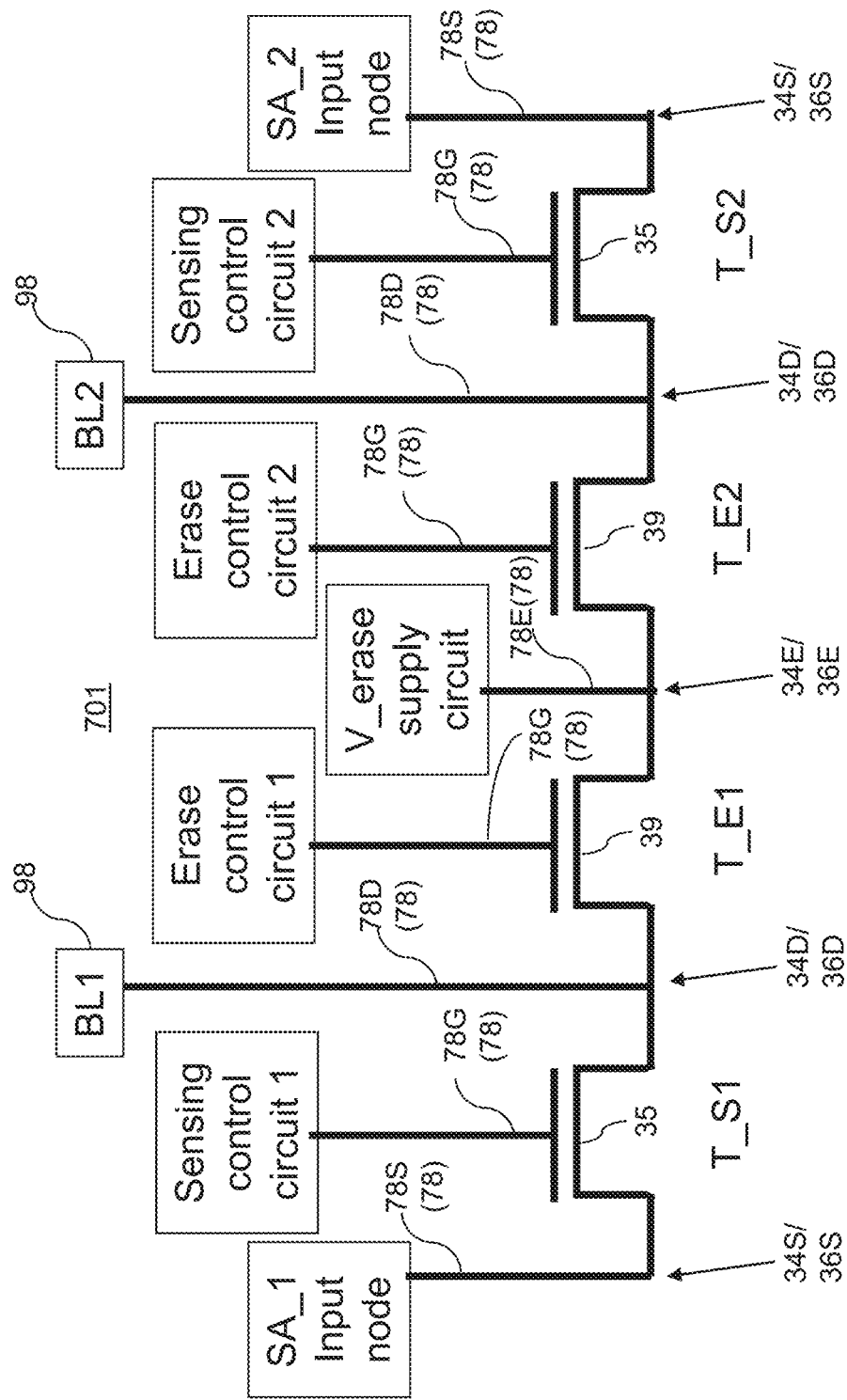
FIG. 13 is a schematic circuit diagram of a circuit that can be formed employing the exemplary structure of FIGS. 12A and 12B according to an embodiment of the present disclosure.

Referring to FIG. 13, a schematic circuit diagram is shown for the bit line switch circuit 701 that can be formed employing the exemplary structure of FIGS. 12A and 12B according to an embodiment of the present disclosure. The first field effect transistors in the exemplary structure of FIGS. 12A and 12B may comprise a first sense-amplifier-connection field effect transistor T_S1 and a second sense-amplifier-connection field effect transistor T_S2. The second field effect transistors in the exemplary structure of FIGS. 12A and 12B may comprise a first erase-voltage-connection field effect transistor T_E1 and a second erase-voltage-connection field effect transistor T_E2. The first source region (34S, 36S) of each first field effect transistor can be electrically connected to a respective sense amplifier input node, which is represented as SA_1 input node or SA_2 input node. The second source region (34E, 36E) of each second field effect transistor, which is a common structure between the two second field effect transistors, can be electrically connected to an erase voltage output of an erase voltage supply circuit, which is herein referred to as V_erase supply circuit. Each first gate electrode (52S, 54S) of the first field effect transistors can be electrically connected to a respective sensing control circuit, which is represented as Sensing control circuit 1 or Sensing control circuit 2. Each sensing control circuit generates a signal for turning on or turning off a respective first field effect transistor. Specifically, when a first field effect transistor is turned on, a bit line 98 can be electrically connected to a sense amplifier input node. When a first field effect transistor is turned off, the bit line 98 can be electrically disconnected from the sense amplifier input node. Each drain region (34D, 36D) can be a common drain region for a pair of a first field effect transistor (e.g., T_S1) and a second field effect transistor (e.g., T_E2). Each drain region (34D, 36D) can be electrically connected to a respective bit line 98, which is represented as BL1 or BL2.

Figure 14:
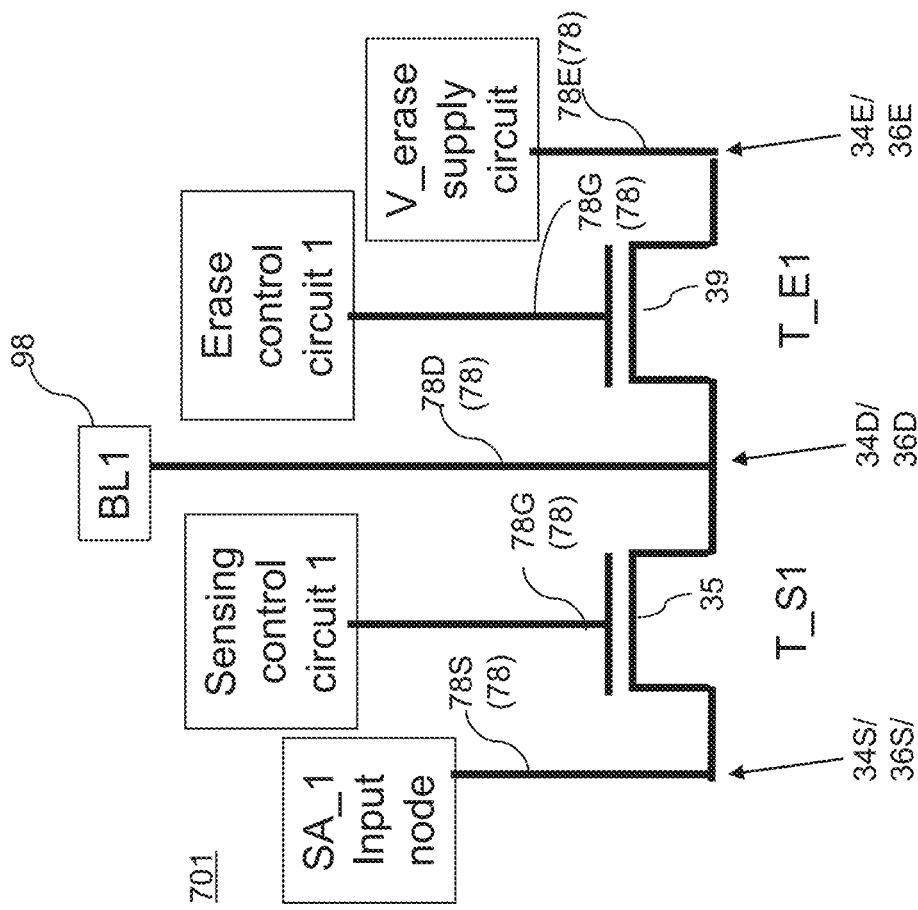
FIG. 14 is a schematic circuit diagram of an alternative circuit that can be derived from the exemplary structure of FIGS. 12A and 12B according to an embodiment of the present disclosure.

Referring to FIG. 14, a schematic circuit diagram of an alternative circuit 701 that can be derived from the exemplary structure of FIGS. 12A and 12B according to an embodiment of the present disclosure. The circuit illustrated in FIG. 14 can be derived from the circuit of FIG. 13 by forming a single first field effect transistor T_S1 and a single second field effect transistor T_E1 in one active region.

Thus, the access to a given bit line 98 which is electrically connected to the shared drain region (34D, 36D) is shared by neighboring first and second field effect transistors (e.g., T_S1 and T_E1). The first field effect transistor (e.g., T_S1) controls the application of writing (i.e., programming) and reading voltages to the bit line 98, while the second field effect transistor (e.g., T_E1) controls the application of an erase voltage to the bit line 98.

Typically, if the memory device is erased using gate induced drain leakage (GIDL) method, then the erase voltage applied to the second source contact via structure 78E and the second gate contact via structure 78G of the second (e.g., erase) field effect transistor T_E1 during the erase operation is higher than the write (i.e., program) and sensing voltages applied to the first source contact via structure 78S and the first gate contact via structure 78G of the first (e.g., sense) field effect transistor T_S1 during the write and sense operations. The high GIDL erase voltage then flows through the shared drain region (34D, 36D) and the shared drain contact via structure 78D to the respective bit line 98. However, the high GIDL erase voltage also flows into the first semiconductor channel 35 from the shared drain region (34D, 36D) and may cause breakdown (e.g., gate dielectric 50S breakdown) of the first field effect transistor T_S1. This effect is especially pronounced if the first field effect transistor T_S1 is a low voltage transistor which has a small channel width and a relatively thin gate dielectric 50S. However, by adding the concave drain extension region 32 between the shared drain region (34D, 36D) and the first semiconductor channel 35, the breakdown effect of the high erase voltage on the first field effect transistor is reduced.

The various embodiments of the present disclosure can be employed to provide a first field effect transistor including a concave drain extension region 32, which effectively increases electrical isolation between the shared drain region (34D, 36D) and the source region (34S, 36S) of the first field effect transistor, without significantly increasing the width of the first field effect transistor T_S1. Thus, the first field effect transistor including the concave drain extension region 32 can provide superior electrical isolation characteristics without significantly increasing the total area employed to form the first field effect transistor and without requiring a relatively thick gate dielectric 50S. The small footprint of the first field effect transistor T_S1 can be advantageously employed to provide a compact bit line switch circuit 701.

Figure 15:
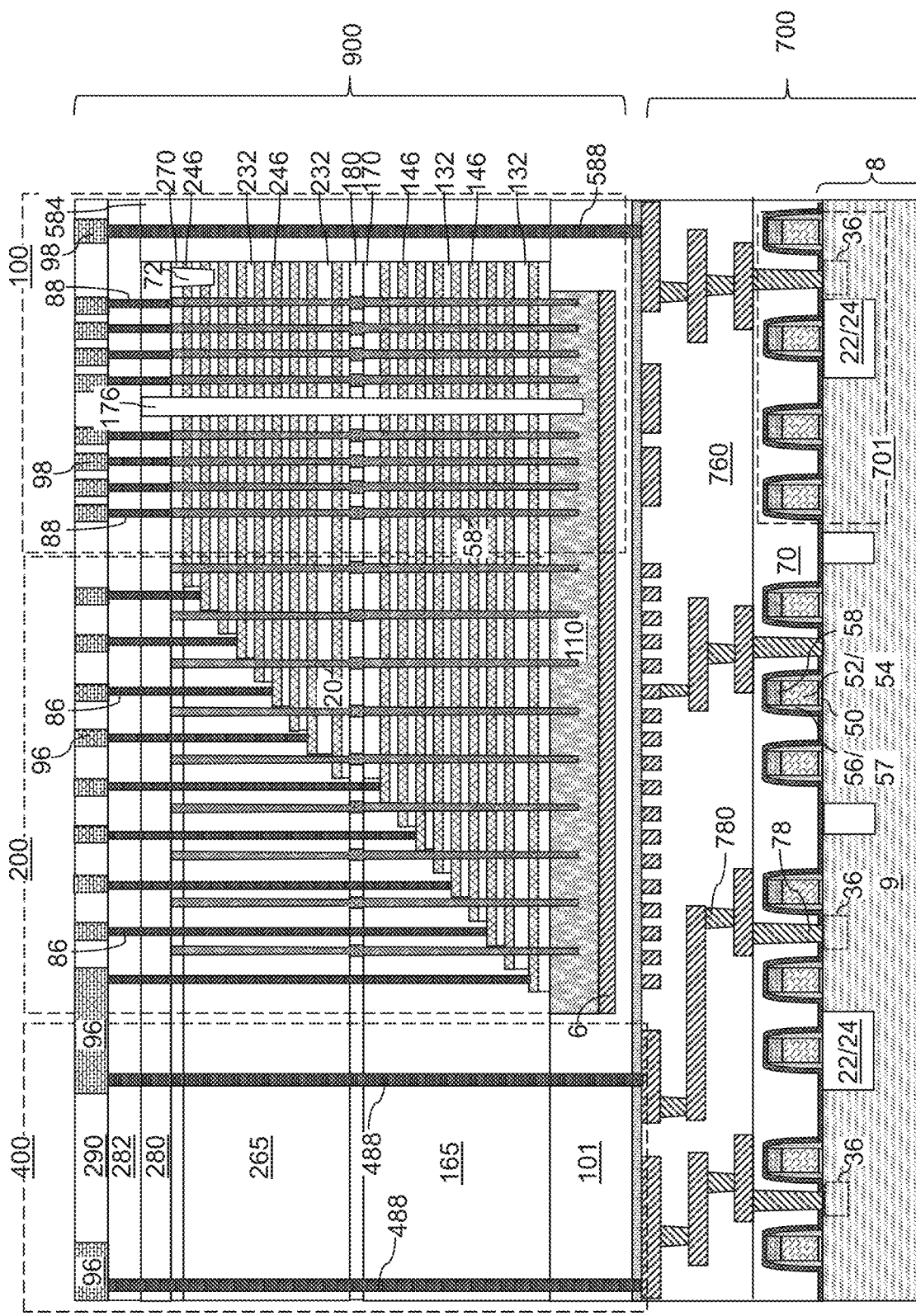
FIG. 15 is a vertical cross-sectional view of the exemplary structure after formation of a three-dimensional memory device over the driver circuit including the exemplary structure of FIGS. 12A and 12B according to an embodiment of the present disclosure.

Generally, a two-dimensional array of the circuits 701 illustrated in FIG. 13 or the circuits illustrated in FIG. 14 can be formed on a semiconductor substrate 8, and can be employed as a bit line switch circuit for bit lines 98 electrically connected to an array of memory elements, which may be a two-dimensional array of memory elements or a three-dimensional array of memory elements. An exemplary application of a two-dimensional array of the circuits 701 illustrated in FIG. 13 or the circuit illustrated in FIG. 14 as a bit line switch circuit is illustrated in FIG. 15, which includes a three-dimensional memory device (e.g., an array of vertical NAND strings) 900 that is formed above the bit line switch circuit 701. Alternatively, the three-dimensional memory device 900 illustrated in FIG. 15 may be formed on a separate substrate (i.e., as a separate semiconductor die) and then bonded to the driver circuit 700 containing the bit line switch circuit 701 located over the substrate 8.

Generally, the semiconductor circuit (e.g., driver circuit) 700 including the bit line switch circuit 701 of FIGS. 12A to 14 can be formed over the substrate 8. Lower-level dielectric material layers 760 embedding lower-level metal interconnect structures 780 are then formed over the contact-level dielectric layer 70. The memory device 900 is then either grown layer by layer over the driver circuit 700 or if formed on a separate substrate and then bonded to the driver circuit 700 using mating bonding pads.

The memory device 900 includes a dielectric matrix layer 101 embedding an optional metallic plate layer 6 and a semiconductor material layer 110. A three-dimensional memory array can be formed thereupon, which may include a first-tier alternating stack of first insulating layers 132 and first electrically conductive layers 146, a first insulating cap layer 170, an inter-tier dielectric layer 180, a second-tier alternating stack of second insulating layers 232 and second electrically conductive layers 246, and a second insulating cap layer 270. The first-tier alternating stack may comprise first stepped surfaces, and a first retro-stepped dielectric material portion 165 may overlie the first stepped surfaces. The second-tier alternating stack may comprise second stepped surfaces, and a second retro-stepped dielectric material portion 265 may overlie the second stepped surfaces. Memory openings and support openings can be formed through the first-tier alternating stack and the second-tier alternating stack, and memory opening fill structures 58 can be formed in the memory openings and support pillar structures 20 can be formed in the support openings. Each of the memory opening fill structures 58 may comprise a vertical stack of memory elements (such as portions of a film located at levels of the first electrically conductive layers 146 and the second electrically conductive layers 246) and a vertical semiconductor channel extending through each layer within the first-tier alternating stack and the second-tier alternating stack. The memory film may comprise a charge storage layer (e.g., silicon nitride layer) located between a tunneling dielectric and a blocking dielectric. The electrically conductive layers (146, 246) comprise word lines located between source select gate electrodes and drain select gate electrodes.

Backside trenches and isolation trenches may be formed to divide the first-tier alternating stack and the second-tier alternating stack along a word line direction, which is the direction along which the first electrically conductive layers and the second electrically conductive layers laterally extend. The backside trenches may be filled with backside trench fill structures 176, and the isolation trenches may be filled with isolation structures 72. Various upper-level dielectric material layers (280, 282, 290) may be formed above the alternating stacks. Each of the memory opening fill structures 58 may include a respective drain region at a top end of a respective vertical semiconductor channel, and drain contact via structures 88 may contact the drain regions. Word line contact via structures 86 may contact the first electrically conductive layers 146 and the second electrically conductive layers 246. Bit lines 98 are electrically connected to a respective subset of the drain contact via structures 88. Word-line-connection metal interconnect structures 96 can be formed in the upper-level dielectric material layers (280, 282, 290). Connection via structures (488, 588) can be formed through the retro-stepped dielectric material portions (165, 265) or dielectric pillar structures 584 to provide vertically-extending electrical connections between lower-level metal interconnect structures 780 and upper-level metal structures such as the bit lines 98 and the word-line-connection metal interconnect structures 96. Alternatively, the memory device 900 may be formed on a separate substrate and then bonded to the driver circuit 700 upside down, such that the bit lines 98 are located between the memory opening fill structures 58 and the lower-level metal interconnect structures 780. In this case, connection via structures 588 may be omitted.

The bit lines 98 are electrically connected to the shared drain region (34D, 36D) of a respective combination of a first field effect transistor (e.g., T_S1) and a second field effect transistor (e.g., T_E1) illustrated in FIG. 12A, 13 or 14. The combination of the first field effect transistor and the second field effect transistor functions as a bit line switch that electrically connects the bit line 98 to a sensing circuit during a sensing and programming operation, and electrically connects the bit line 98 to an erase voltage supply circuit during an erase operation.

Referring to all drawings and according to various embodiments of the present disclosure, a semiconductor structure comprising a first field effect transistor is provided. The first field effect transistor comprises: a first source region (34S, 36S) embedded in a semiconductor material layer 9 that has a doping of a first conductivity type, wherein the first source region (34S, 36S) has a doping of a second conductivity type that is an opposite of the first conductivity type; a drain region (34D, 36D) embedded in the semiconductor material layer 9 and having a doping of the second conductivity type and laterally spaced from the first source region (34S, 36S) by a first semiconductor channel region 35 along a first horizontal direction hd1; a first gate stack (50S, 52S, 54S, 58S) comprising a first gate dielectric 50S and a first gate electrode (52S, 54S) disposed over the first semiconductor channel region 35; a first shallow trench isolation portion 22 embedded in an upper portion of the semiconductor material layer 9 and contacting the drain region (34D, 36D) and the first gate stack (50S, 52S, 54S, 58S); and a concave drain extension region 32 having a doping of the second conductivity type continuously extending underneath the first shallow trench isolation portion 22 from a bottom surface of the first gate dielectric 50S to a bottom surface of the drain region (34D, 36D).

In one embodiment, the semiconductor structure comprises a second field effect transistor. The second field effect transistor can comprise: a second source region (34E, 36E) embedded in the semiconductor material layer 9 and having a doping of the second conductivity type; a second gate stack (50E, 52E, 54E, 58E) comprising a second gate dielectric 50E and a second gate electrode (52E, 54E) and disposed over a portion of the semiconductor material layer 9 located between the second source region (34E, 36E) and the drain region (34D, 36D), wherein a planar interface between the semiconductor material layer 9 and the second gate stack (50E, 52E, 54E, 58E) continuously extends between the second source region (34E, 36E) and the drain region (34D, 36D).

In one embodiment, the semiconductor structure comprises: an array of NAND memory elements (located within memory opening fill structures 58); and bit lines 98 connected to a respective column of NAND memory elements within the array of NAND memory elements, wherein: the drain region (34D, 36D) is electrically connected to a bit line 98 among the bit lines 98; the first source region (34S, 36S) is electrically connected to a sense amplifier input node; and the second source region (34E, 36E) is electrically connected to an erase voltage power supply circuit.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising a first field effect transistor, the first field effect transistor comprising:
   a first source region embedded in a semiconductor material layer that has a doping of a first conductivity type, wherein the first source region has a doping of a second conductivity type that is an opposite of the first conductivity type;
   a drain region embedded in the semiconductor material layer and having a doping of the second conductivity type and laterally spaced from the first source region by a first semiconductor channel region along a first horizontal direction;

a first gate stack comprising a first gate dielectric and a first gate electrode disposed over the first semiconductor channel region;

a first shallow trench isolation portion embedded in an upper portion of the semiconductor material layer and contacting the drain region and the first gate stack; and a concave drain extension region having a doping of the second conductivity type continuously extending underneath the first shallow trench isolation portion from a bottom surface of the first gate dielectric to a bottom surface of the drain region.

2. The semiconductor structure of claim 1, wherein the first shallow trench isolation portion comprises a first tapered sidewall extending straight from a topmost surface of the first shallow trench isolation portion to a bottom surface of the first shallow trench isolation portion.

3. The semiconductor structure of claim 2, wherein the first tapered sidewall comprises:

a first surface segment in contact with a tapered sidewall segment of the gate electrode;

a second surface segment in contact with a sidewall of the gate dielectric; and a third surface segment in contact with a tapered sidewall of the concave drain extension region.

4. The semiconductor structure of claim 3, wherein a bottom edge of a straight sidewall of the gate electrode contacts the topmost surface of the first shallow trench isolation portion, and is laterally offset from a top edge of the tapered sidewall segment of the gate electrode by a lateral offset distance along the first horizontal direction.

5. The semiconductor structure of claim 3, wherein:

a first segment of the topmost surface of the first shallow trench isolation portion contacts a planar bottom surface segment of the first gate electrode; and a second segment of the topmost surface of the first shallow trench isolation portion contacts a first bottom surface of a first dielectric gate spacer that laterally surrounds the first gate electrode.

6. The semiconductor structure of claim 5, wherein the planar bottom surface segment of the first gate electrode is located above a horizontal plane including an interface between the first gate dielectric and the first gate electrode.

7. The semiconductor structure of claim 5, wherein the first shallow trench isolation portion comprises:

a vertical sidewall adjoined to an edge of the topmost surface of the first shallow trench isolation portion and vertically coincident with an outer sidewall of the first dielectric gate spacer; and a recessed horizontal surface that is adjoined to a bottom edge of the vertical sidewall of the first shallow trench isolation portion and located above a horizontal plane including a top surface of the semiconductor material layer.

8. The semiconductor structure of claim 2, wherein the first gate electrode comprises:

a first semiconductor gate electrode portion in contact with the first gate dielectric and a first surface segment of the first shallow trench isolation portion; and a first metallic gate electrode portion in contact with a top surface of the first semiconductor gate electrode portion and in contact with a first segment of the topmost surface of the first shallow trench isolation portion.

9. The semiconductor structure of claim 2, wherein the first shallow trench isolation portion comprises a second tapered sidewall extending straight from above a horizontal plane including an interface between the semiconductor material layer and the first gate stack and contacting a tapered sidewall of the drain region.

10. The semiconductor structure of claim 2, wherein the first shallow trench isolation portion comprises:

a recessed horizontal surface located below the topmost surface of the first shallow trench isolation portion and located above a horizontal plane including an interface between the gate stack and the semiconductor material layer; and a second tapered sidewall extending straight from the recessed horizontal surface of the first shallow trench isolation portion to the bottom surface of the first shallow trench isolation portion and contacting the drain region.

11. The semiconductor structure of claim 10, wherein a p-n junction between the concave drain extension region and the semiconductor material layer comprises a first p-n junction segment that is parallel to the first tapered sidewall of the first shallow trench isolation portion, a second p-n junction segment that is parallel to the second tapered sidewall of the first shallow trench isolation portion, and a third p-n junction segment that underlies the bottom surface of the first shallow trench isolation portion.

12. The semiconductor structure of claim 1, wherein:

the concave drain extension region continuously extends underneath the first shallow trench isolation portion from the first semiconductor channel region to the bottom surface of the drain region;

the first source region comprises a first source extension region having a bottom surface located at a first depth from a horizontal plane including an interface between the semiconductor material layer and the first gate stack, and a first deep source region having a bottom surface located at a second depth from the horizontal plane that is greater than the first depth;

the drain region comprises a deep drain region having a bottom surface located at the second depth from the horizontal plane; and the concave drain extension region includes dopants of the second conductivity type at a lower atomic concentration than the first source extension region.

13. The semiconductor structure of claim 1, further comprising a second field effect transistor that comprises:

a second source region embedded in the semiconductor material layer and having a doping of the second conductivity type;

a second gate stack comprising a second gate dielectric and a second gate electrode and disposed over a second semiconductor channel region located in a portion of the semiconductor material layer located between the second source region and the drain region, wherein a planar interface between the semiconductor material layer and the second gate stack continuously extends between the second source region and the drain region.

14. The semiconductor structure of claim 13, further comprising a peripheral shallow trench isolation portion laterally surrounding the first source region, the drain region, the first shallow trench isolation portion, and the second source region, wherein the first shallow trench isolation portion and the peripheral shallow trench isolation portion are connected portions of a shallow trench isolation structure comprising a dielectric fill material.

15. The semiconductor structure of claim 13, further comprising:

a three-dimensional memory device comprising vertical NAND strings and bit lines, wherein:
the drain region is electrically connected to one of the bit lines;
the first source region is electrically connected to a sense amplifier input node; and
the second source region is electrically connected to an erase voltage power supply circuit.

16. A method of forming a semiconductor structure, the method comprising:
forming a first shallow trench in an upper portion of a semiconductor material layer having a doping of a first conductivity type;
forming a concave drain extension region having a doping of a second conductivity type that is an opposite of the first conductivity type in a portion of the semiconductor material layer around the first shallow trench;
forming a first shallow trench isolation portion in the first shallow trench;
forming a first gate stack including a first gate dielectric and a first gate electrode over the semiconductor material layer and on the first shallow trench isolation portion; and
forming a first source region and a drain region in the semiconductor material layer, wherein the drain region is formed in direct contact with the first shallow trench isolation portion and the first source region is laterally spaced from the first shallow trench isolation portion.

17. The method of claim 16, wherein:
the first shallow trench comprises a first tapered sidewall and a second tapered sidewall that are laterally spaced apart along a first horizontal direction and laterally extend along a second horizontal direction that is perpendicular to the first horizontal direction; and
the first gate stack is formed directly on a top surface of the concave drain extension region and directly on a first segment of a topmost surface of the first shallow trench isolation portion.

18. The method of claim 16, further comprising forming a first dielectric gate spacer around the first gate stack over a second segment of the topmost surface of the first shallow trench isolation portion and directly on a segment of a top surface of the semiconductor material layer.

19. The method of claim 18, further comprising:
forming a hard mask layer over the semiconductor material layer;
patterning the hard mask layer with a first pattern of openings therethrough;
performing a first anisotropic etch process that transfers the first pattern of openings in the hard mask layer into the upper portion of the semiconductor material layer to form the first shallow trench;
implanting dopants of the second conductivity type into the portion of the semiconductor material layer around the first shallow trench to form the concave drain extension region;
forming a second pattern of openings through the hard mask layer while covering the first shallow trench with a photoresist layer;
performing a second anisotropic etch process that transfers the second pattern of openings into the upper portion of the semiconductor material layer to form a second shallow trench is formed in the upper portion of the semiconductor material layer;
removing the photoresist layer; and
forming a shallow trench isolation structure in the first shallow trench and in the second shallow trench, wherein the shallow trench isolation structure comprises the first shallow trench isolation portion and a peripheral shallow trench isolation portion that fills the second shallow trench.

20. The method of claim 19, further comprising:
forming a gate dielectric layer and a first gate electrode material layer over the semiconductor material layer, wherein the hard mask layer is formed on the first gate electrode material layer;
removing the hard mask layer after formation of the first shallow trench isolation portion;
forming a second gate electrode material layer on the first gate electrode material layer and the first shallow trench isolation portion; and
patterning the second gate electrode material layer, the first gate electrode material layer, and the gate dielectric layer by performing an anisotropic etch process that etches materials of the second gate electrode material layer and the first gate electrode material layer selective to a material of the first shallow trench isolation portion,
wherein the first gate electrode comprises patterned portion of the second gate electrode material layer and the first gate electrode material layer, and the first gate dielectric comprises a patterned portion of the gate dielectric layer.

* * * * *